US011133403B2

(12) United States Patent
Chen et al.

(10) Patent No.: US 11,133,403 B2
(45) Date of Patent: Sep. 28, 2021

(54) TUNNEL FIELD EFFECT TRANSISTOR

(71) Applicant: TAIWAN SEMICONDUCTOR MANUFACTURING CO., LTD., Hsinchu (TW)

(72) Inventors: I-Sheng Chen, Taipei (TW); Cheng-Hsien Wu, Hsinchu (TW); Chih-Chieh Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/390,172

(22) Filed: Apr. 22, 2019

(65) Prior Publication Data

US 2019/0245065 A1    Aug. 8, 2019

Related U.S. Application Data

(62) Division of application No. 15/590,243, filed on May 9, 2017, now Pat. No. 10,269,934.

(60) Provisional application No. 62/475,320, filed on Mar. 23, 2017.

(51) Int. Cl.
| | |
|---|---|
| *H01L 29/66* | (2006.01) |
| *H01L 29/10* | (2006.01) |
| *H01L 29/739* | (2006.01) |
| *H01L 29/06* | (2006.01) |
| *H01L 27/088* | (2006.01) |
| *H01L 29/775* | (2006.01) |
| *H01L 21/285* | (2006.01) |

(52) U.S. Cl.
CPC ...... *H01L 29/66795* (2013.01); *H01L 27/088* (2013.01); *H01L 29/0673* (2013.01); *H01L 29/1033* (2013.01); *H01L 29/665* (2013.01); *H01L 29/6681* (2013.01); *H01L 29/66545* (2013.01); *H01L 29/66553* (2013.01); *H01L 29/7391* (2013.01); *H01L 21/28518* (2013.01); *H01L 29/775* (2013.01)

(58) Field of Classification Search
CPC .......... H01L 29/66795; H01L 29/7391; H01L 29/6681; H01L 29/0673; H01L 29/1033; H01L 29/66545; H01L 29/665; H01L 29/66553; H01L 29/775; H01L 27/088; H01L 21/28518
See application file for complete search history.

(56) References Cited

U.S. PATENT DOCUMENTS

| | | | |
|---|---|---|---|
| 9,583,399 B1 | 2/2017 | Chen et al. | |
| 2013/0105763 A1* | 5/2013 | Yin | H01L 29/0895 257/24 |
| 2016/0233320 A1* | 8/2016 | Chang | H01L 21/3065 |
| 2017/0104061 A1 | 4/2017 | Peng et al. | |

* cited by examiner

*Primary Examiner* — Laura M Menz
*Assistant Examiner* — Candice Chan
(74) *Attorney, Agent, or Firm* — McClure, Qualey & Rodack, LLP

(57) ABSTRACT

A device includes a substrate, a first doping portion, a second doping portion, a channel, a semiconductor film, a high-k layer, and a gate. The first doping portion and the second doping portion are over the substrate. The channel is over the substrate and between the first doping portion and the second doping portion. The semiconductor film is around the channel. The high-k layer is around the semiconductor film. The gate is over the high-k layer.

20 Claims, 41 Drawing Sheets

TUNNEL FIELD EFFECT TRANSISTOR

RELATED APPLICATIONS

The present application is a Divisional application of U.S. application Ser. No. 15/590,243, filed on May 9, 2017, now U.S. Pat. No. 10,269,934, issued on Apr. 23, 2019, which claims priority of U.S. Provisional Application Ser. No. 62/475,320, filed Mar. 23, 2017, which is herein incorporated by reference in their entireties.

BACKGROUND

The tunnel field-effect transistor (TFET) is a candidate of future transistor due to its steep-slope switch properties and the resulting advantages in ultra-low-power electronic applications. Since subthreshold swing (SS) of TFET is not limited by thermal factor, lowering $V_{DD}$ is achievable without performance degradation in device shrinkage rule.

Vertical transistor architecture is widely used for building TFET circuits. However, this approach has its own challenges including the design and fabrication of the bottom contact. It is a complicated integration flow for vertical TFET. In addition, the on-state current is conflict with device area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
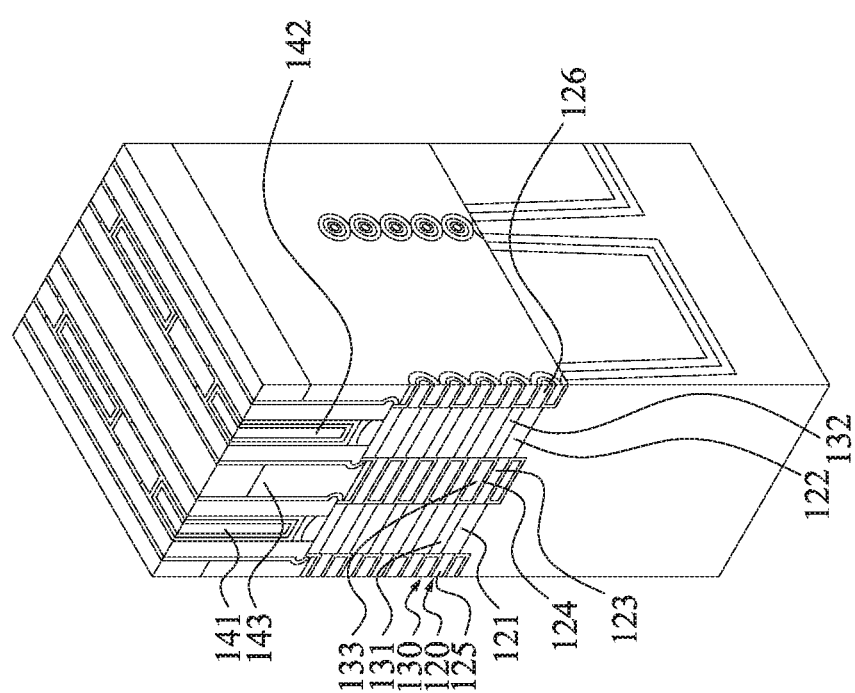
FIG. 1 is a cross-sectional view of a semiconductor device, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is now made to FIG. 1. FIG. 1 is a cross-sectional view of a semiconductor device 100, in accordance with various embodiments of the present disclosure. As illustrated in FIG. 1, the semiconductor device 100 includes a substrate 110, at least one first semiconductor layer 120, and at least one second semiconductor layer 130. The at least one first semiconductor layer 120 is disposed on the substrate 110, and the at least one second semiconductor layer 130 is disposed on the at least one first semiconductor layer 120. In some embodiments, the substrate 110 is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. In various embodiments, the first semiconductor layer 120 is made of, for example, SiGe. In some embodiments, the second semiconductor layer 130 is made of, for example, silicon.

In various embodiments, the at least one first semiconductor layer 120 includes a first doping portion 121, a second doping portion 122, a channel 123, and a semiconductor film 124. The second doping portion 122 is adjacent to the first doping portion 121. The channel 124 is disposed between the first doping portion 121 and the second doping portion 122, and disposed with the substrate 110 in parallel. Explained in a different way, the longer length of the channel 123 is disposed with the substrate 110 in parallel. In some embodiments, the semiconductor film 124 is disposed around the channel 123. As illustrated in FIG. 1, the semiconductor film 124 is disposed on the top surface of the channel 123, and disposed at the bottom surface of the channel 123. In various embodiments, the first doping portion 121 or the second doping portion 122 is made of, for example, N-type semiconductor, such as $In_xGa_{1-x}As$, Ge, II-doped InGaAs, GaSb, $GaAs_xSb_{1-x}$, $Ge_xSn_{1-x}$. In some embodiments, the first doping portion 121 or the second doping portion 122 is made of, for example, P-type semiconductor, such as $In_xGa_{1-x}As$, $Si_xGe_{1-x}$, Ge, $Ge_xSn_{1-x}$.

In some embodiments, the at least one first semiconductor layer 120 includes a first semiconductor portion 125 and a second semiconductor portion 126. The first semiconductor portion 125 is disposed adjacent to the first doping portion 121, and the second semiconductor portion 126 is disposed adjacent to the second doping portion 122. As illustrated in FIG. 1, the first semiconductor portion 125 is disposed at the left side of the first doping portion 121, and the second semiconductor portion 126 is disposed at right side of the second doping portion 122. In various embodiments, the first semiconductor portion 125, the first doping portion 121, the channel 123, the second doping portion 122, and the second semiconductor portion 126 are disposed in sequence. The disposition sequence in the first semiconductor layer 120 is given for illustrative purposes. Various disposition sequence in the first semiconductor layer 120 is within the contemplated scope of the present disclosure.

In various embodiments, the at least one second semiconductor layer 130 includes an interface portion 133. The interface portion 133 is disposed on the channel 123, and the interface portion 133 together with the channel 123 are vertically disposed with the substrate 110. Explained in a different way, the connection line between the interface portion 133 and the channel 123 are vertically disposed with the substrate 110. The disposition relation in the semiconductor device 100 is given for illustrative purposes. Various disposition relation in the semiconductor device 100 is within the contemplated scope of the present disclosure.

In some embodiments, the at least one second semiconductor layer 130 further includes a third semiconductor portion 131 and a fourth semiconductor portion 132. The third semiconductor portion 131 is disposed on the first doping portion 121, and the fourth semiconductor portion 132 is disposed on the second doping portion 122. The third semiconductor portion 131 together with the first doping portion 121 are vertically disposed with the substrate 110. Explained in a different way, the connection line between the third semiconductor portion 131 and the first doping portion 121 are vertically disposed with the substrate 110. The fourth semiconductor portion 132 together with the second doping portion 122 are vertically disposed with the substrate 110. Explained in a different way, the connection line between the fourth semiconductor portion 132 and the second doping portion 122 are vertically disposed with the substrate 110. The disposition relation in the semiconductor device 100 is given for illustrative purposes. Various disposition relation in the semiconductor device 100 is within the contemplated scope of the present disclosure.

In various embodiments, the semiconductor device 100 further includes a first conducting portion 143. The first conducting portion 143 is coupled to the channel 123, and the first conducting portion 143 is aligned with the interface portion 124 and the channel 123. It is noted that although the above-mentioned description only introduces layers 120, 130, the structure and the sequence of the rest layers as illustrated in FIG. 1 are the same as the layers 120, 130. Explained in a different way, the semiconductor device 100 includes a plurality of the first semiconductor layers 120 and the second semiconductor layers 130. The first semiconductor layers 120 and the second semiconductor layers 130 are disposed in turn, and the top layer among layers 120, 130 is the first semiconductor layers 120. Hence, the channel 123 of the first semiconductor layers 120 is also on the top; and therefore, the first conducting portion 143 is coupled to the channel 123 on the top.

In some embodiments, the semiconductor device 100 includes a second conducting portion 141 and a third conducting portion 143. The second conducting portion 141 is coupled to the first doping portion 121, and the second conducting portion 141 is aligned with the third semiconductor portion 131 and the first doping portion 121. The third conducting portion 142 is coupled to the second doping portion, and the third conducting portion 142 is aligned with the fourth semiconductor portion 132 and the second doping portion 122. As illustrated in FIG. 1, the conducting portions 141~143 are disposed with each other in parallel. In various embodiments, the conducting portions 141~143 are conducted out on the same surface of the semiconductor device 100 (i.e., the top surface of the semiconductor device 100). In some embodiments, the conducting portions 141, 142 are exposed on the same surface of the semiconductor device 100 (i.e., the top surface of the semiconductor device 100).

Figure 2:
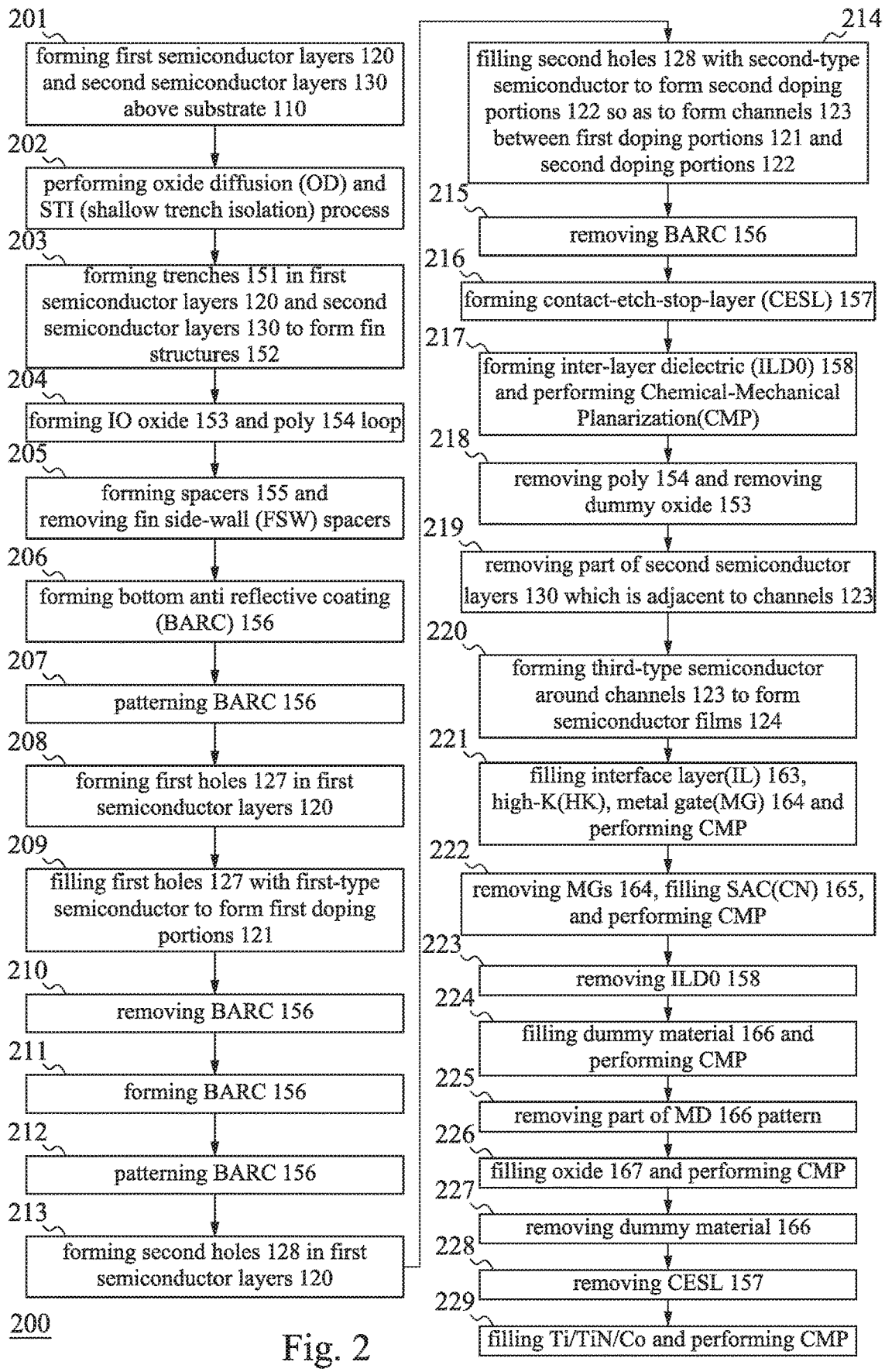
FIG. 2 is a flow chart of a method for fabricating the semiconductor device in FIG. 1, in accordance with various embodiments.

Reference is now made to FIG. 2. FIG. 2 is a flow chart of a method 200 for fabricating the semiconductor device 100 in FIG. 1, in accordance with various embodiments of the present disclosure. For illustration, the fabricating process of the semiconductor device 100 in FIG. 1 is described by the method 200 together with FIG. 3 to FIG. 31. FIG. 3 to FIG. 31 are cross-sectional views of different steps of the method 200 for fabricating the semiconductor device 100 in FIG. 1, in accordance with various embodiments.

Figure 3:
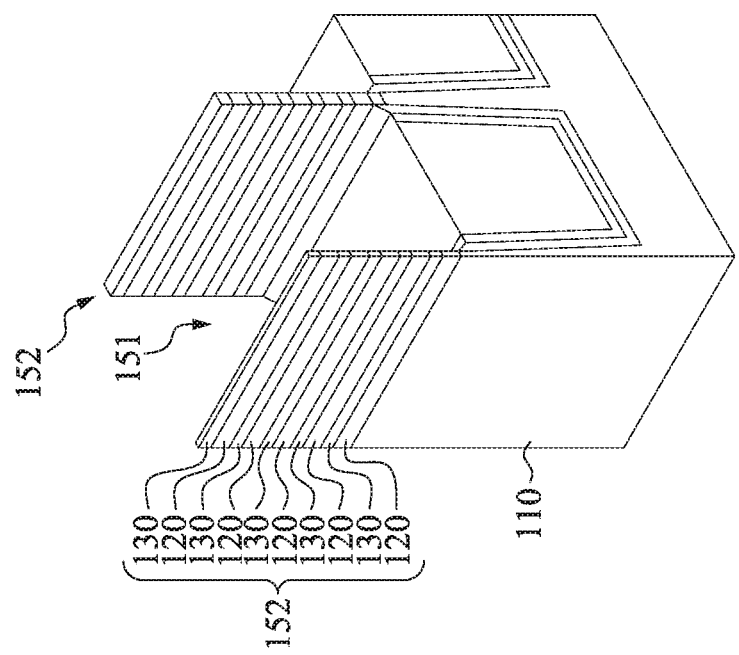

With reference to the method 200 in FIG. 2, in operations 201~203, first semiconductor layers 120 and second semiconductor layers 130 are formed above the substrate 110, oxide diffusion (OD) and STI (shallow trench isolation) process are performed thereon, and the first semiconductor layers 120 and the second semiconductor layers 130 are etched to form the trench 151 and fin structures 152, as illustrated in FIG. 3. In some embodiments, the first semiconductor layers 120 and the second semiconductor layers 130 are deposited on the substrate 110 in turn. Explained in another way, the sequence of the disposition is the first semiconductor layer 120, the second semiconductor layer 130, the first semiconductor layer 120, the second semiconductor layer 130, and so on. In some embodiments, the first semiconductor layers 120 and the second semiconductor layers 130 are deposited by chemical vapor deposition (CVD), for example, low-pressure CVD (LPCVD), atomic layer CVD (ALCVD), ultrahigh vacuum CVD (UHVCVD), reduced pressure CVD (RPCVD), or other suitable CVDs; molecular beam epitaxy (MBE) process; other suitable epitaxial processes; or combinations thereof. As illustrated in FIG. 3, the first semiconductor layer 120 is disposed with the substrate 110 in a parallel manner.

Figure 4:
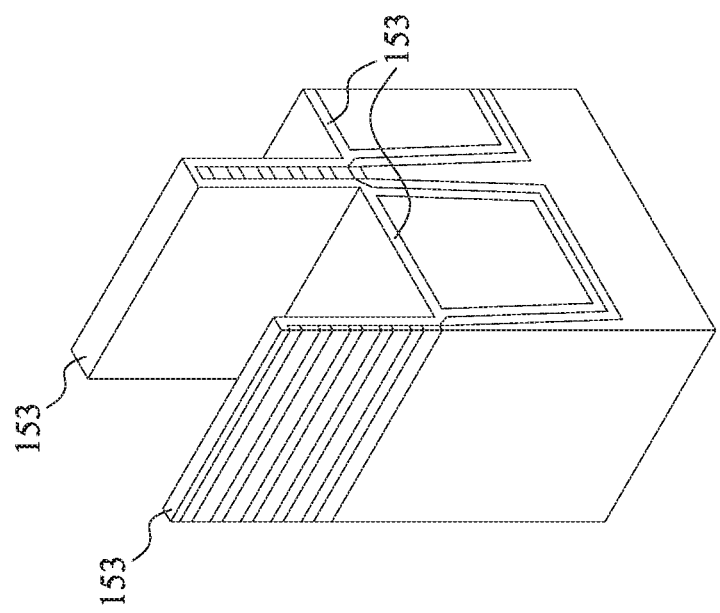
FIGS. 3-31 are cross sectional views of the semiconductor device in FIG. 1 at different stages of a manufacturing process, in accordance with some embodiments of the present disclosure.
Figure 6:
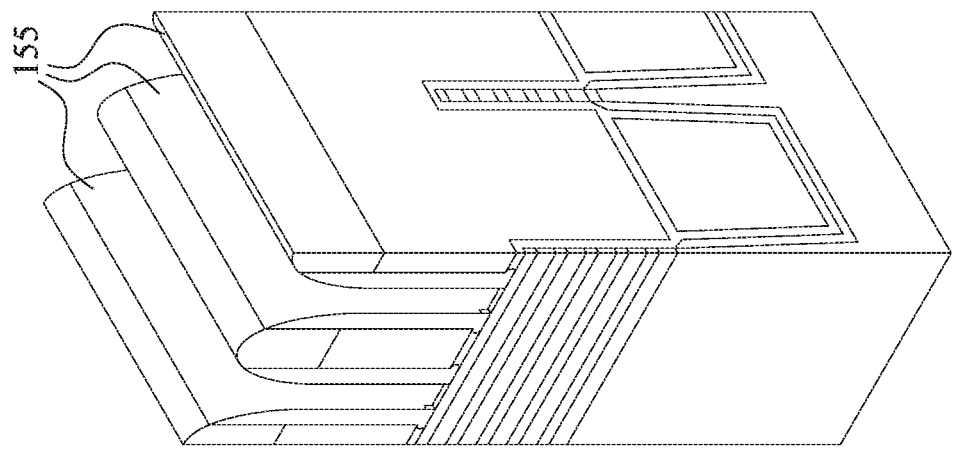
Figure 5:
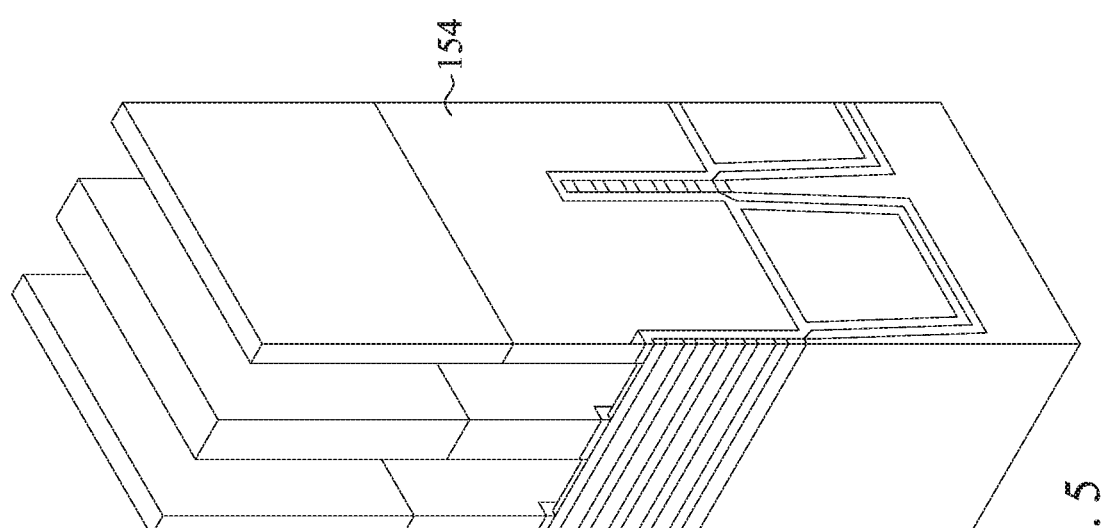
Figure 7:
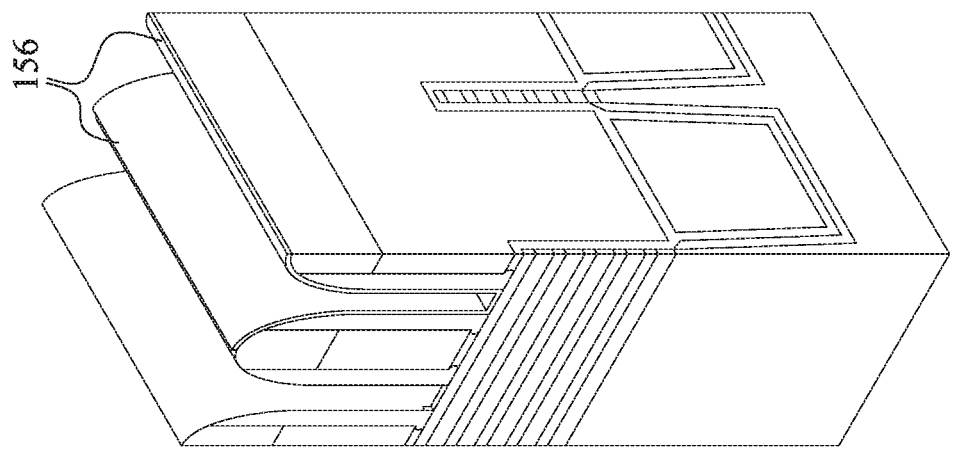
Figure 8:
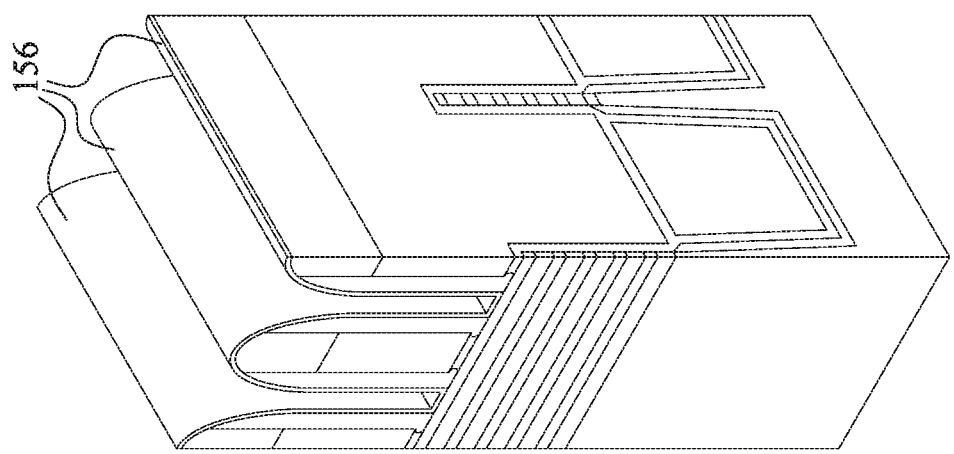

In operation 204, an input-output (IO) oxide 153 is forming, as illustrated in FIG. 4; subsequently, poly 154 loop is preformed, as illustrated in FIG. 5. In operation 205, spacers 155 are formed and fin side-wall spacers are removed, as illustrated in FIG. 6. In operation 206, a bottom anti reflective coating (BARC) 156 is formed, as illustrated in FIG. 7. In operation 207, BARC 156 is patterned, as illustrated in FIG. 8. Explained in another way, the left part of the BARC 156 as illustrated in FIG. 7 is removed. In some embodiments, the first doping portion 121 or the IO oxide 153 is made of, for example, silicon oxide, silicon nitride, metal oxide.

Figure 10:
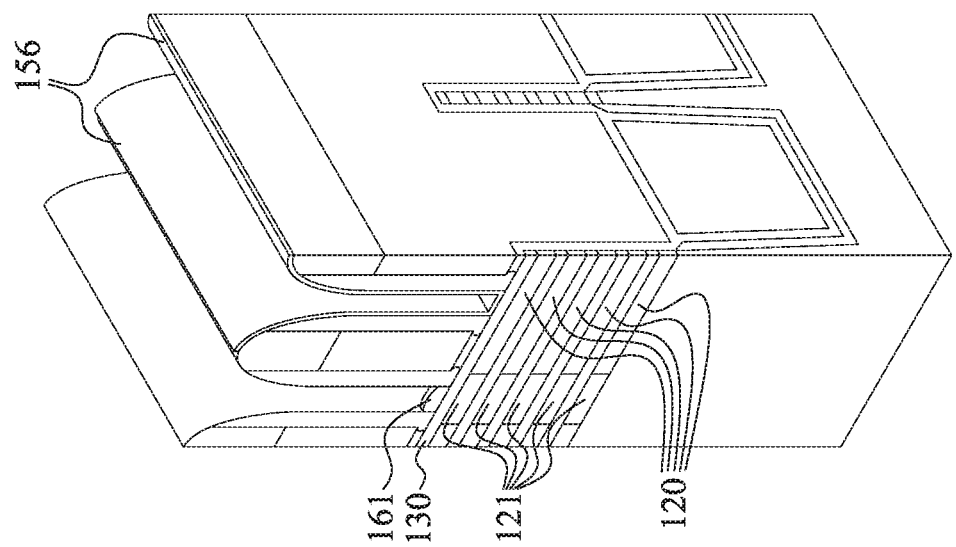
Figure 9:
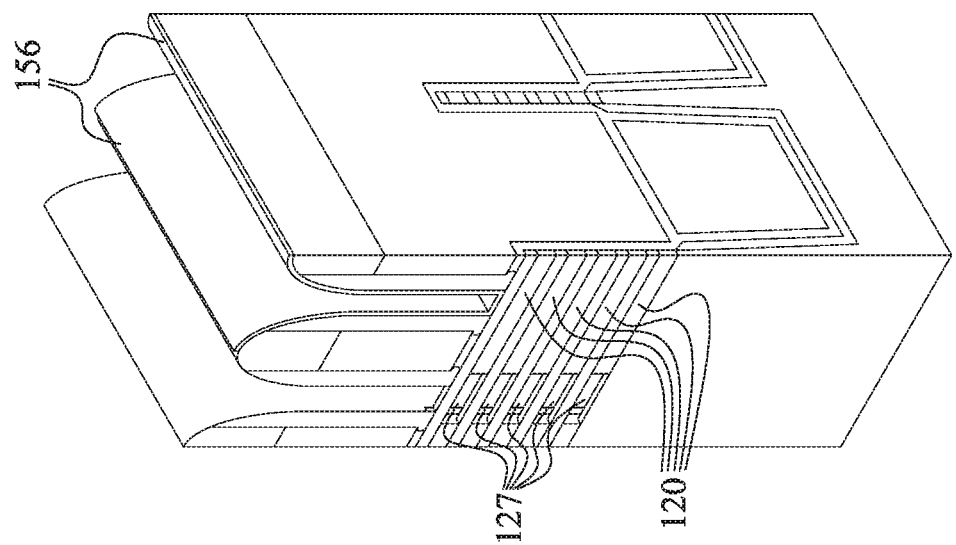

In operation 208, first holes 127 in the first semiconductor layers 120 are formed, as illustrated in FIG. 9. Explained in another way, the left part of the first semiconductor layers 120 are etched to form such first holes 127. In operation 209, the first holes 127 are filled with first-type semiconductor to form first doping portions 121, as illustrated in FIG. 10. In various embodiments, the first doping portions 121 are epitaxial grown in the first holes 127. In some embodiments, the first doping portions 121 are overlapped with each other and disposed with the substrate 110 vertically. In various embodiments, a first connection point 161 is formed on the second semiconductor 130 with the first-type semiconductor, and the first connection point 161 is aligned with the first doping portions 121.

Figure 12:
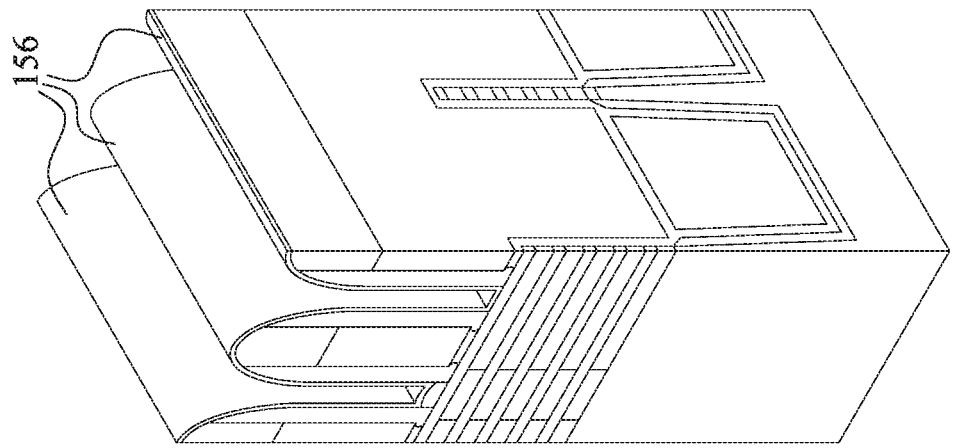
Figure 11:
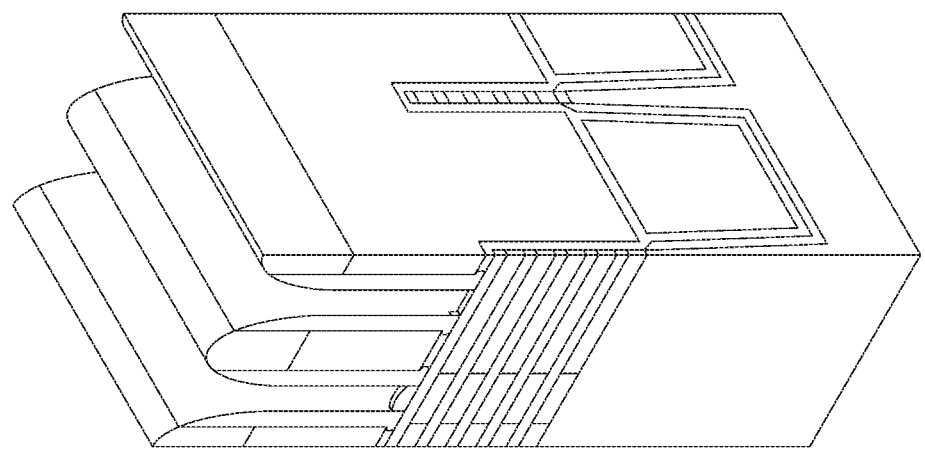
Figure 13:
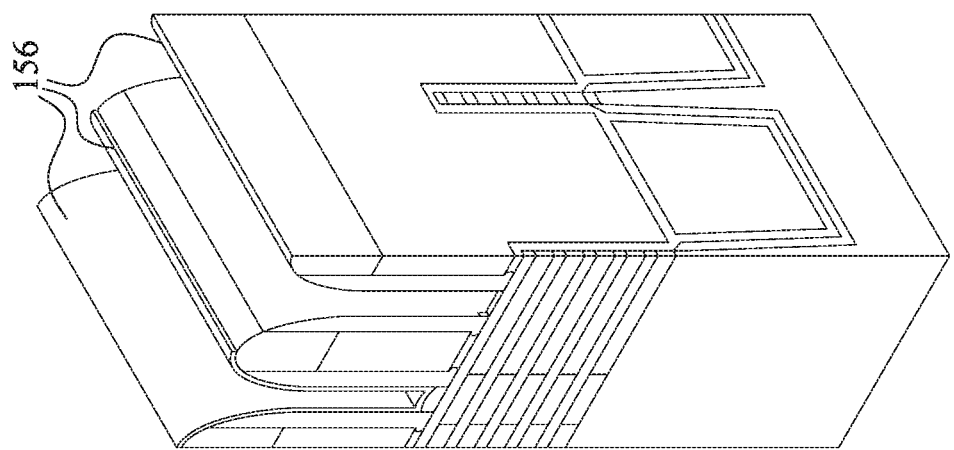

In operation 210, BARC 156 is removed, as illustrated in FIG. 11. Explained in another way, the right part of the BARC 156 as illustrated in FIG. 10 is removed. In operation 211, BARC 156 is formed again for facilitating the rest operations, as illustrated in FIG. 12. In operation 212, BARC 156 is patterned, as illustrated in FIG. 13. Explained in another way, the right part of the BARC 156 as illustrated in FIG. 12 is removed.

Figure 14:
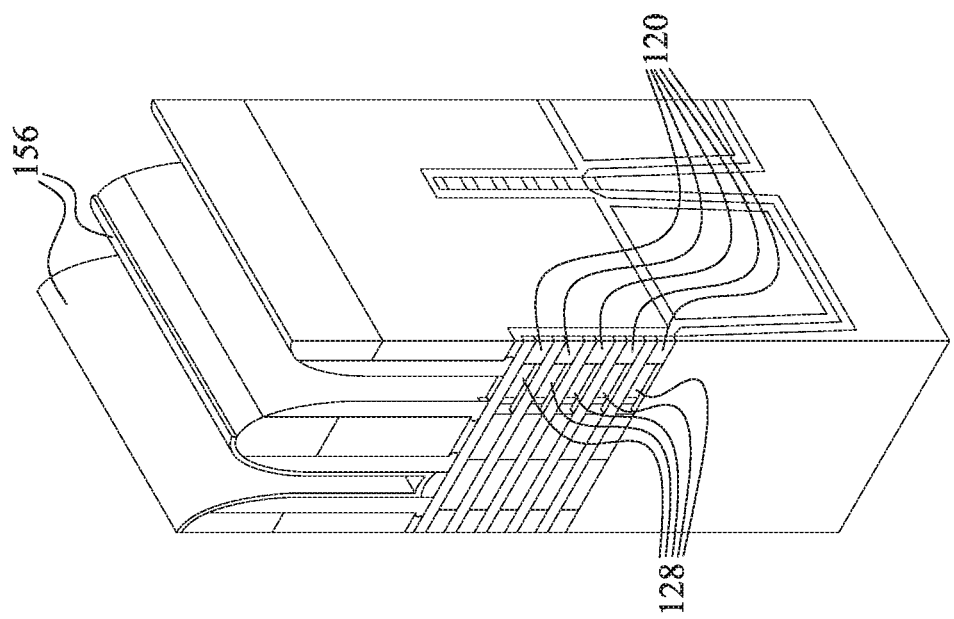
Figure 15:
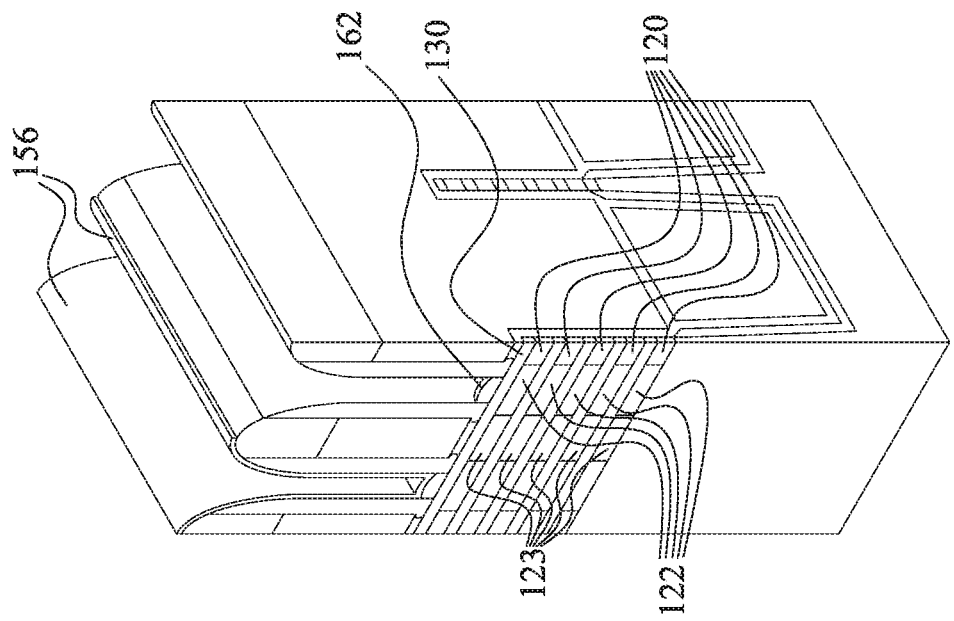

In operation 213, second holes 128 in the first semiconductor layers 120 are formed, as illustrated in FIG. 14. Explained in another way, the right part of the first semiconductor layers 120 are etched to form such second holes 128. In operation 214, the second holes 128 are filled with second-type semiconductor to form second doping portions 122 so as to form channels 123 between the first doping portions 121 and the second doping portions 122, as illustrated in FIG. 15. In various embodiments, the second doping portions 122 are epitaxial grown in the second holes 128. In some embodiments, the second doping portions 122 are overlapped with each other and disposed with the substrate 110 vertically. In various embodiments, a second connection point 162 is formed on the second semiconductor 130 with the second-type semiconductor, and the second connection point 162 is aligned with the second doping portions 122. As illustrated in FIG. 15, in one of the first semiconductor layer 120, the channel 123 is located between the first doping portion 121 and the second doping portion 122, and the first doping portion 121, the channel 123 and the second doping portion 122 are disposed in sequence.

Figure 16:
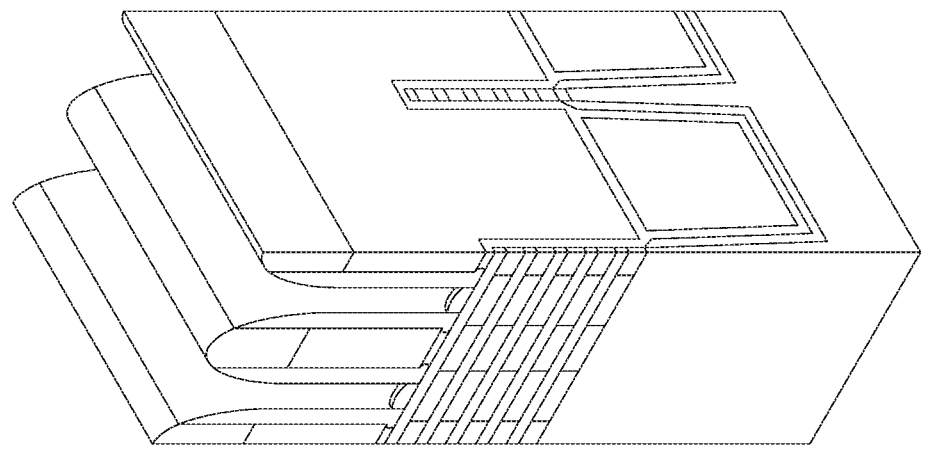
Figure 18:
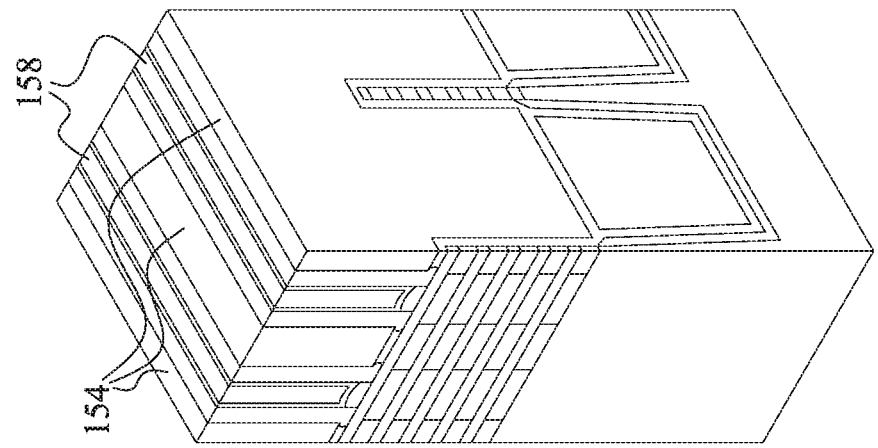
Figure 17:
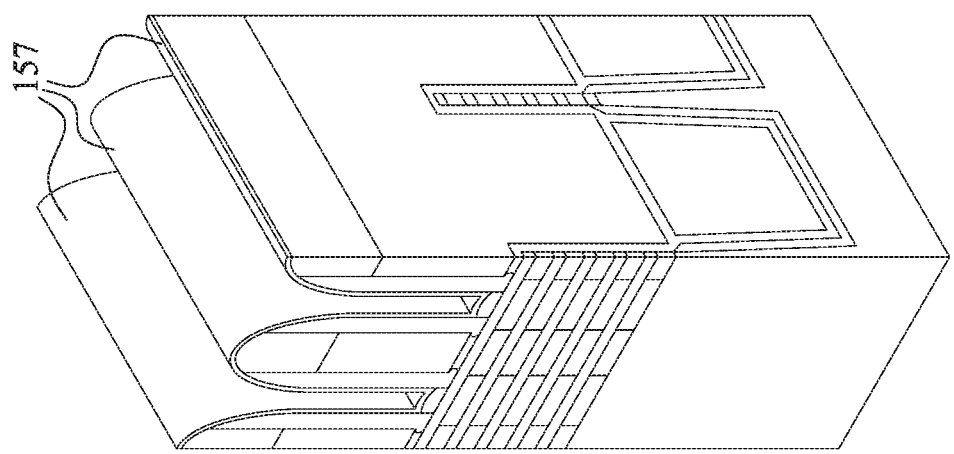
Figure 20:
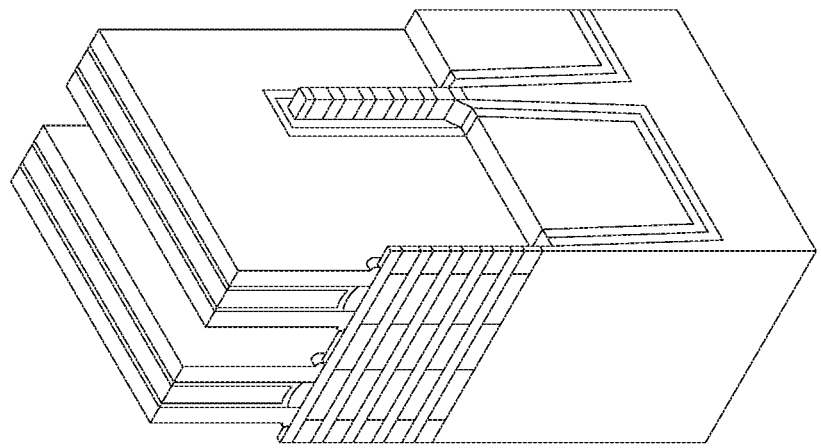
Figure 19:
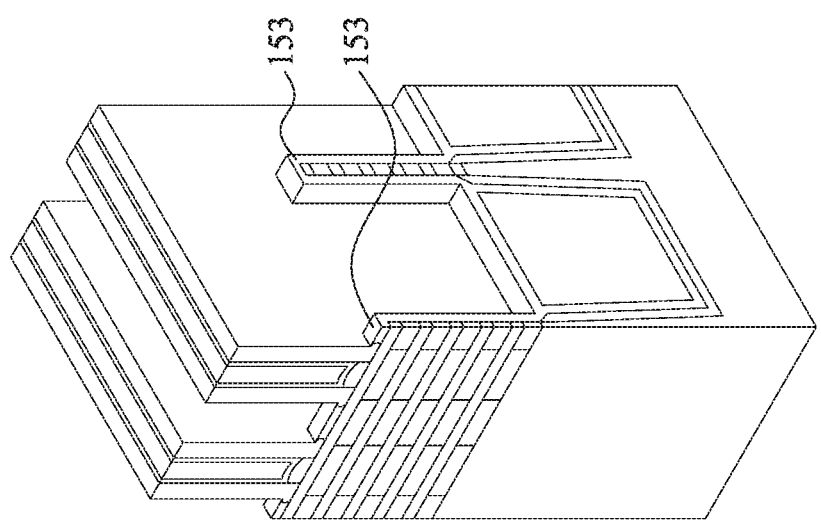

In operation 215, BARC 156 is removed, as illustrated in FIG. 16. Explained in another way, the left part of the BARC 156 as illustrated in FIG. 15 is removed. In operation 216, a contact-etch-stop-layer (CESL) 157 is formed, as illustrated in FIG. 17. In operation 217, an inter-layer dielectric (ILD0) 158 is formed, and a Chemical-Mechanical Planarization (CMP) is performed, as illustrated in FIG. 18. In operation 218, the poly 154 is removed as illustrated in FIG. 19, and the dummy oxide 153 is removed as illustrated in FIG. 20.

Figure 22:
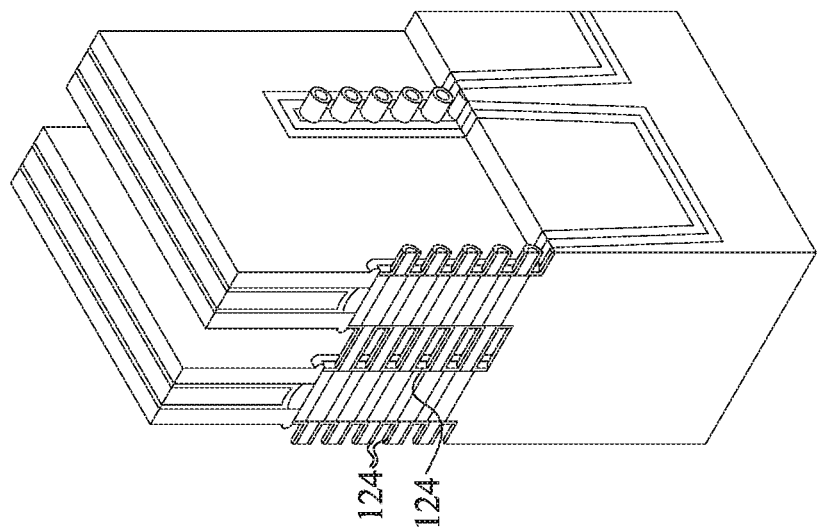
Figure 21:
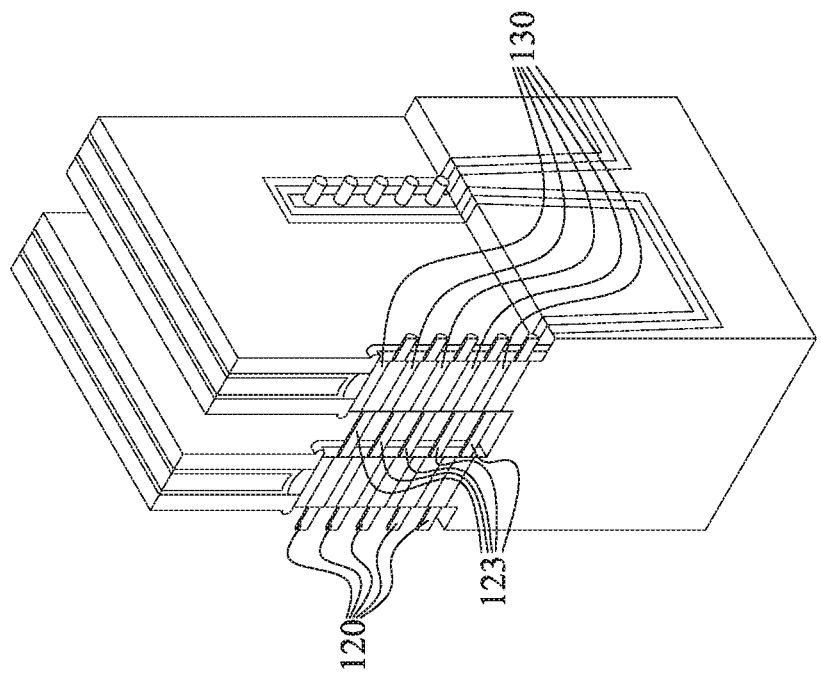

In operation 219, part of second semiconductor layers 130 which is adjacent to channels 123 are removed, as illustrated in FIG. 21. In operation 220, third-type semiconductor is formed around channels 123 to form semiconductor films 124, as illustrated in FIG. 22.

Figure 24:
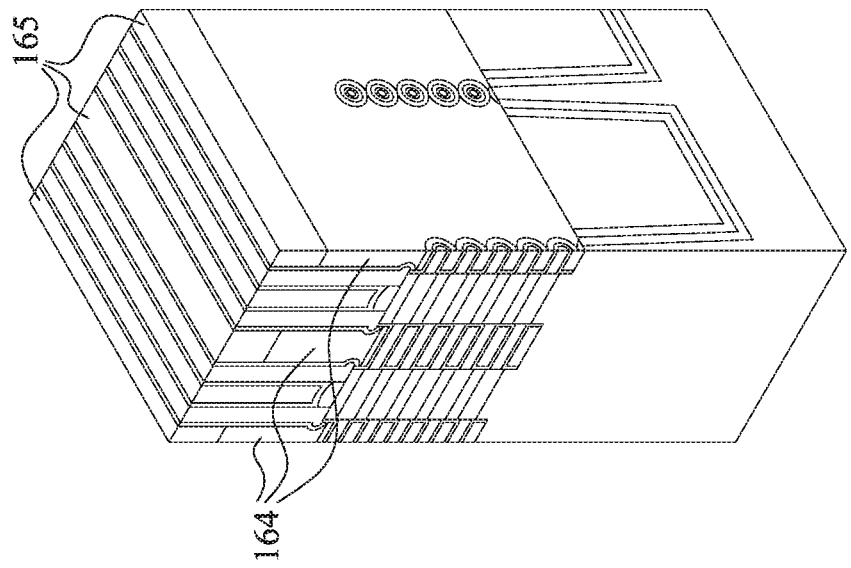
Figure 23:
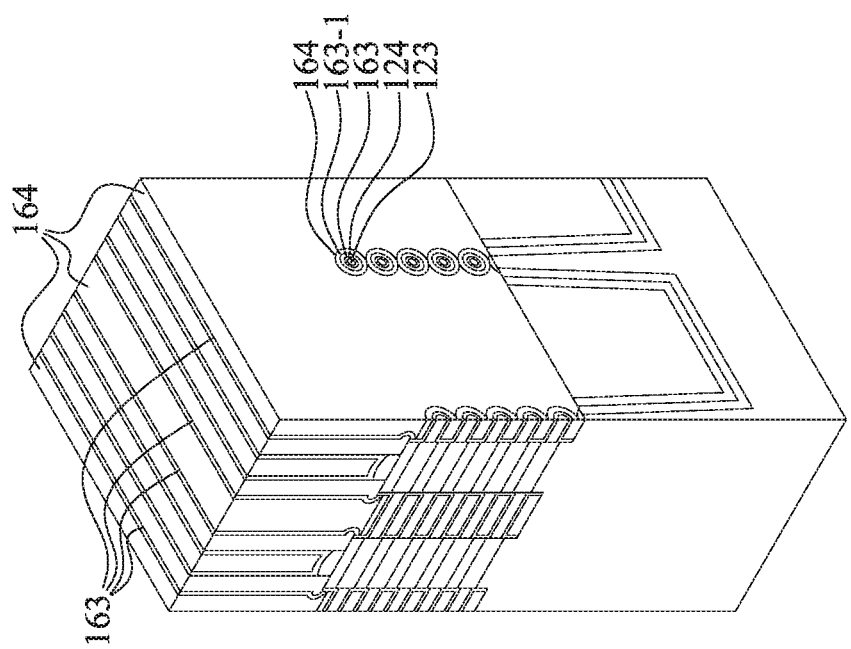
Figure 26:
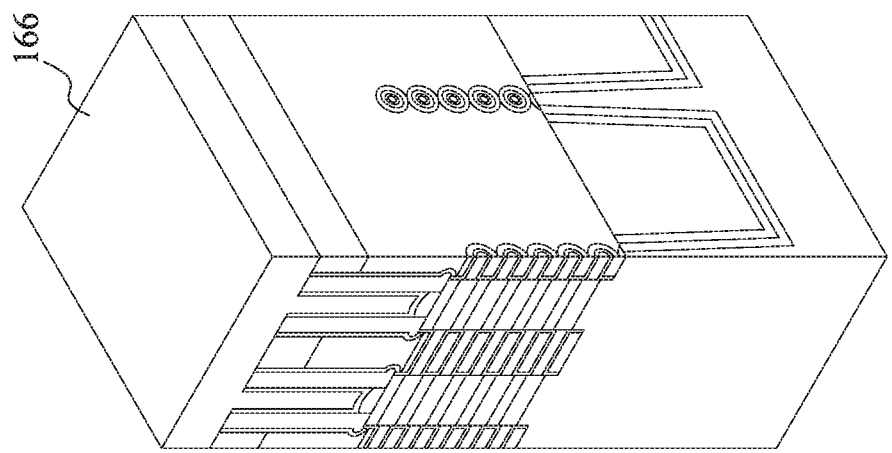
Figure 25:
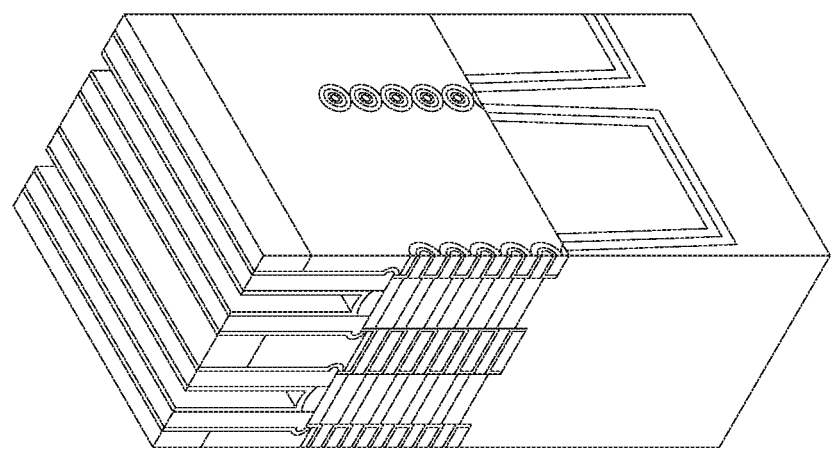
Figure 28:
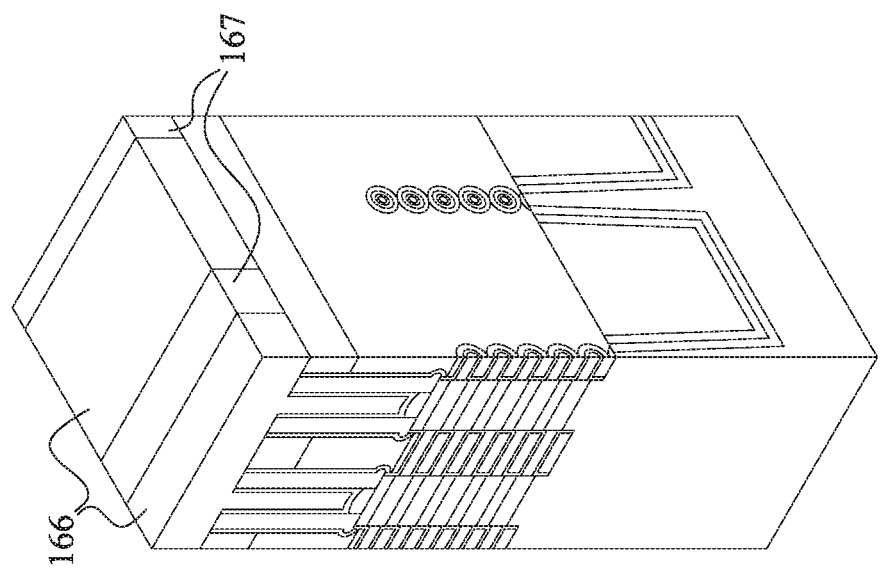
Figure 27:
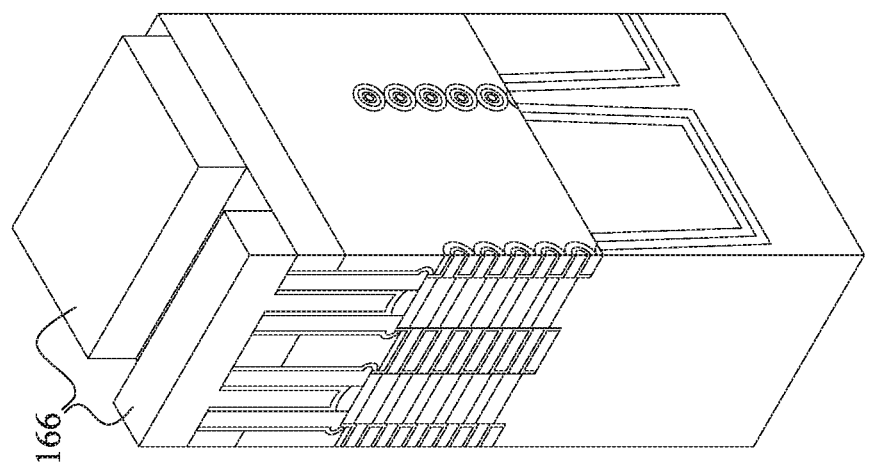
Figure 30:
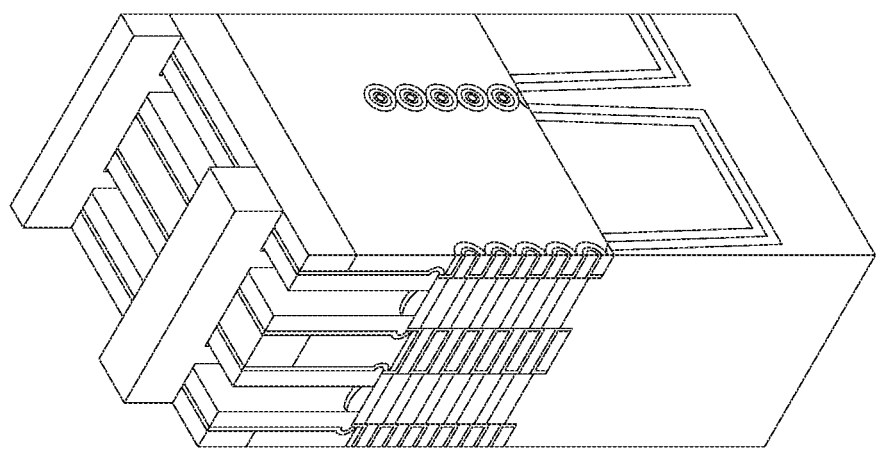
Figure 29:
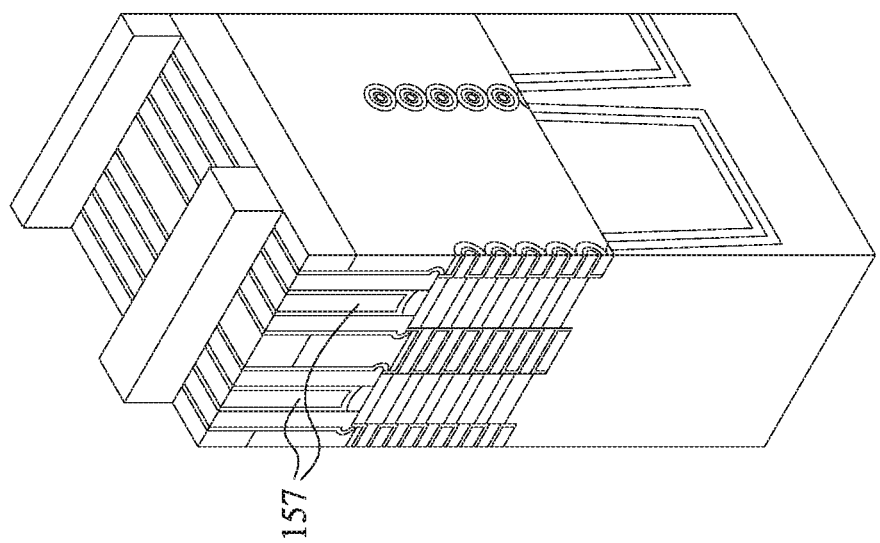
Figure 31:
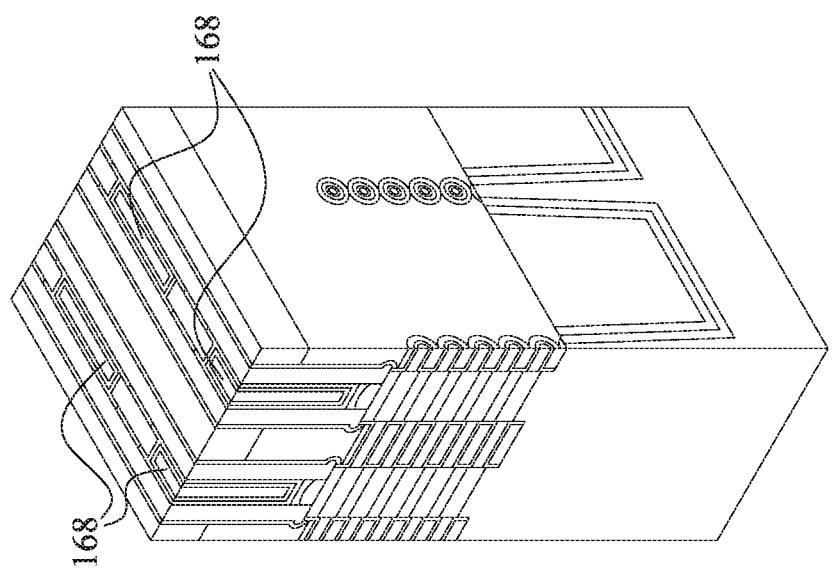

In operation 221, interface layers (IL) 163, high-K (HK) 163-1, metal gates (MG) 164 are filled, and CMP is performed, as illustrated in FIG. 23. In operation 222, part of the MGs 164 are removed, SAC (SN) 165 are filled, and CMP is performed as illustrated in FIG. 24. In operation 223, ILD0s 158 are removed, as illustrated in FIG. 25. In operation 224, dummy material 166 is filled, and CMP is performed as illustrated in FIG. 26. In operation 225, part of the dummy material 166 is removed, as illustrated in FIG. 27. In operation 226, oxides 167 are filled, and CMP is performed as illustrated in FIG. 28. In operation 227, the dummy material 166 is removed, as illustrated in FIG. 29. In operation 228, the CESL 157 is removed, as illustrated in FIG. 30. In operation 229, Ti/TiN/Co 168 is filled, and CMP is performed as illustrated in FIG. 31. In some embodiments, the dummy material 166 is made of, for example, amorphous silicon, germanium.

In some embodiments, operations 206~215 regarding FIGS. 7-16 are performed to form the first doping portions 121, the channels 123 and the second doping portions 122. However, the manufacturing process of above-mentioned structures are not limited to operations 206~215 regarding FIGS. 7-16. In various embodiments, such manufacturing processes of above-mentioned structures are described by the method 200A in FIG. 32 together with FIG. 33 to FIG. 40.

Figure 32:
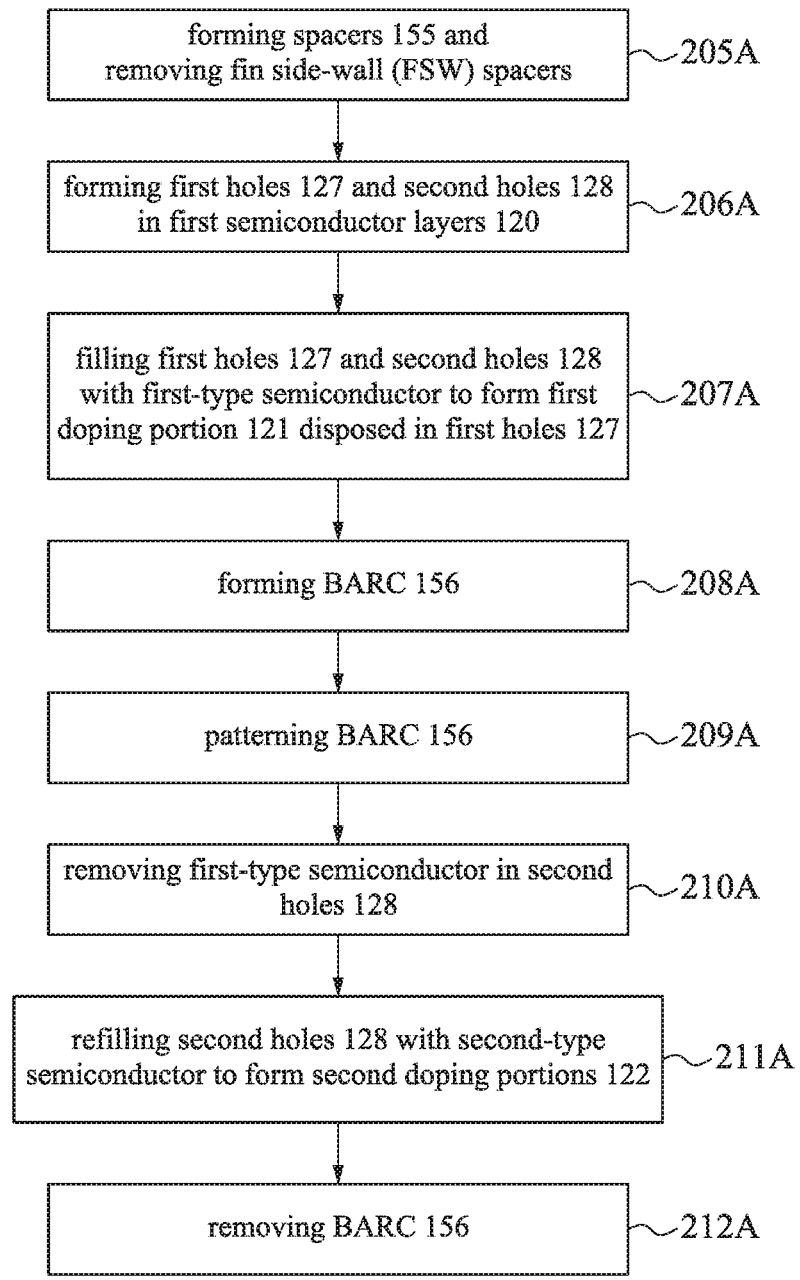
FIG. 32 is a flow chart of a method for fabricating the semiconductor device in FIG. 1, in accordance with various embodiments.
Figure 34:
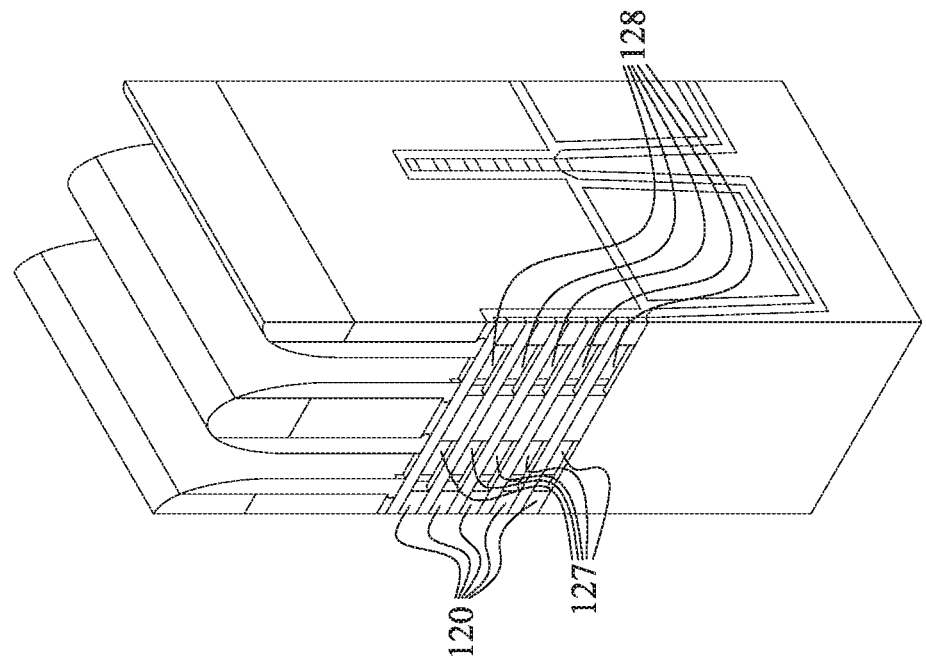
FIGS. 33-40 are cross sectional views of the semiconductor device in FIG. 1 at different stages of a manufacturing process, in accordance with some embodiments of the present disclosure.
Figure 33:
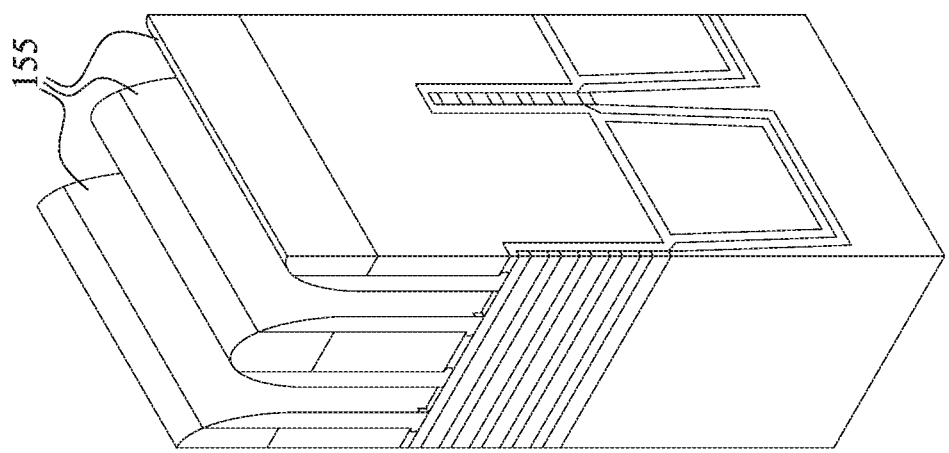

After operation 204 in FIG. 2, in operation 205A of FIG. 32, spacers 155 are formed and fin side-wall spacers are removed, as illustrated in FIG. 33. In operation 206A, the first holes 127 and the second holes 128 in the first semiconductor layers 120 are formed, as illustrated in FIG. 34. In some embodiments, the first holes 127 and the second holes 128 are formed at same time.

Figure 36:
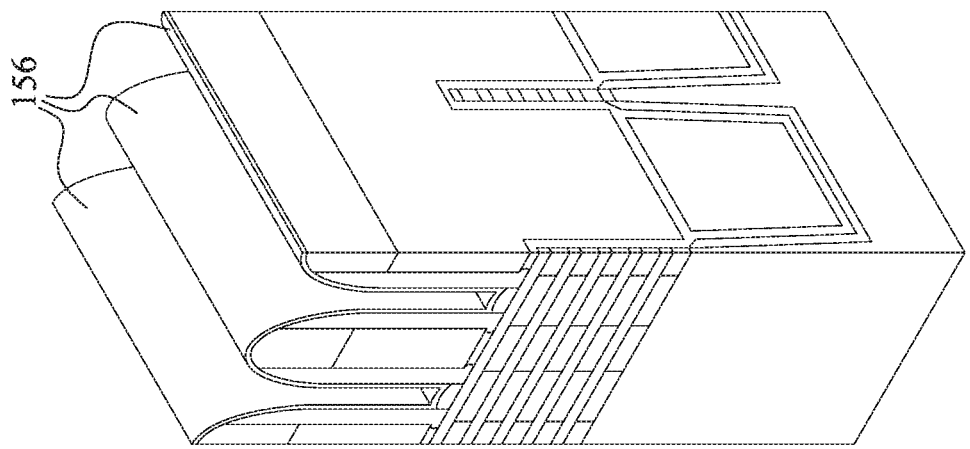
Figure 35:
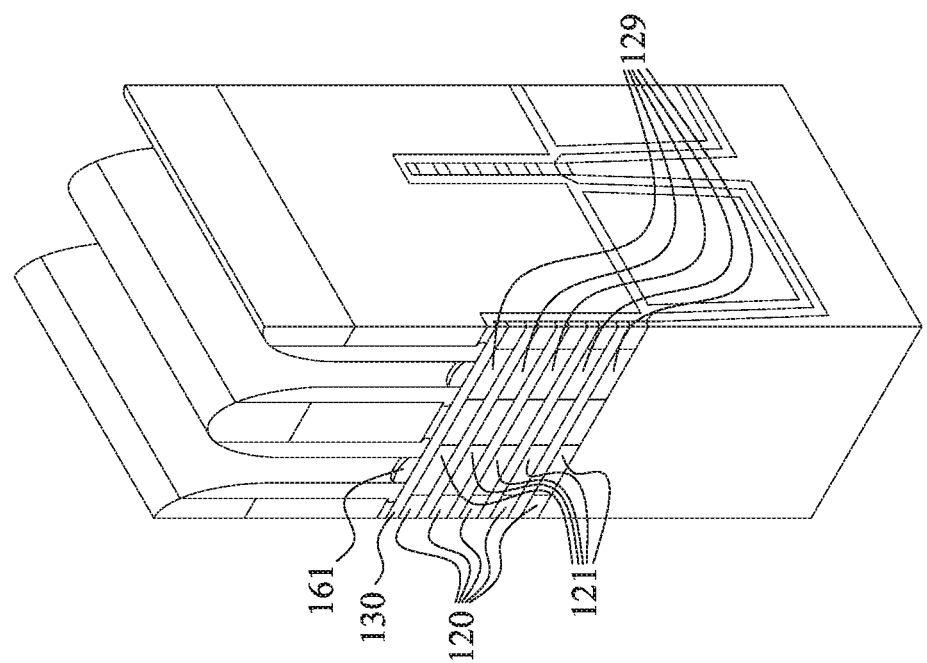
Figure 37:
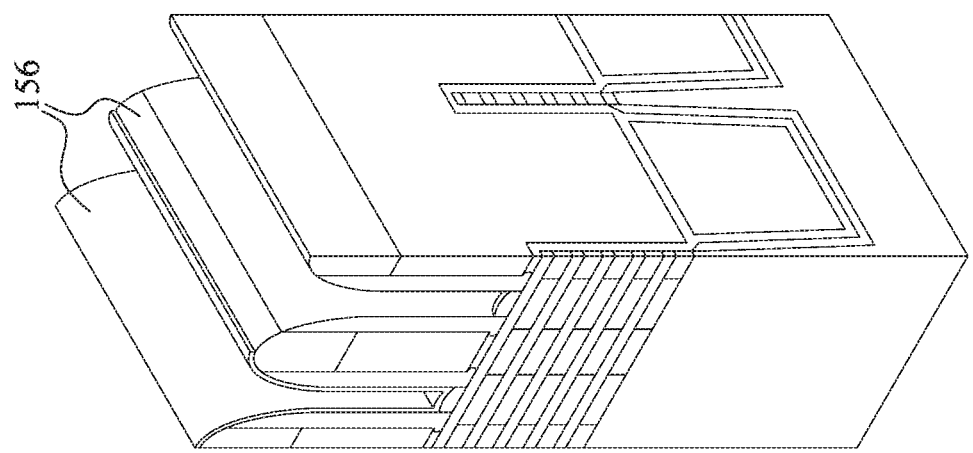

In operation 207A, the first holes 127 and the second holes 128 are filled with first-type semiconductor to form the first doping portions 121 disposed in the first holes 127, and to form third doping portions 129 disposed in the second holes 128, as illustrated in FIG. 35. In some embodiments, a first connection point 161 is formed on the second semiconductor 130 with the first-type semiconductor, and the first connection point 161 is aligned with the first doping portions 121. In operation 208A, BARC 156 is formed, as illustrated in FIG. 36. In operation 209A, BARC 156 is patterned, as illustrated in FIG. 37. Explained in another way, the right part of the BARC 156 as illustrated in FIG. 36 is removed.

Figure 38:
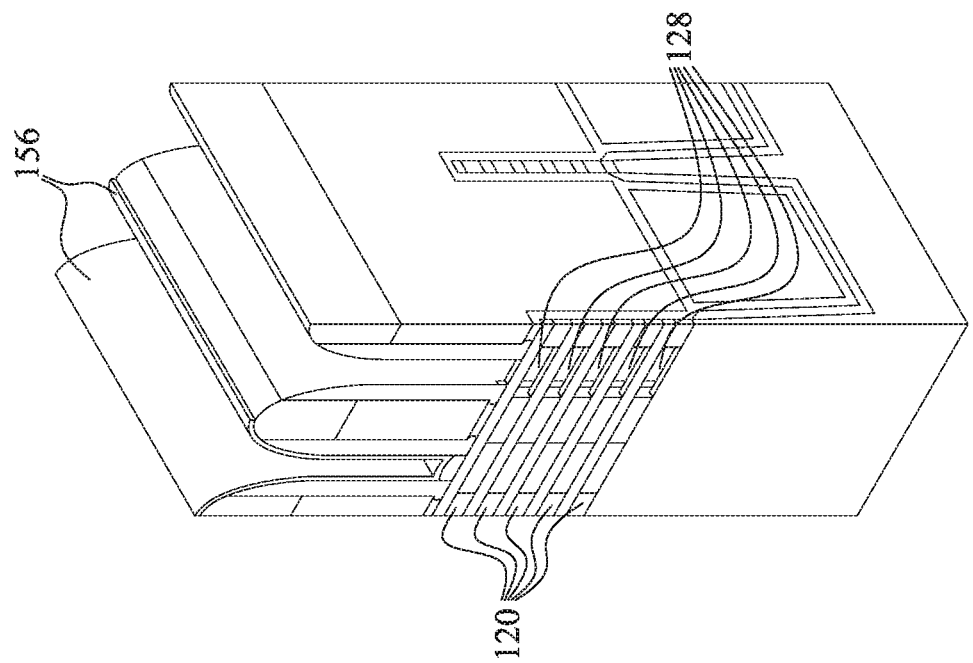
Figure 40:
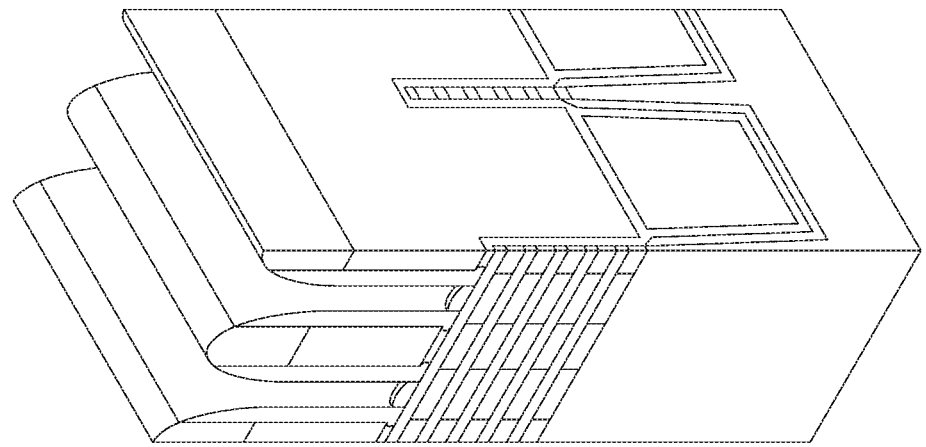
Figure 39:
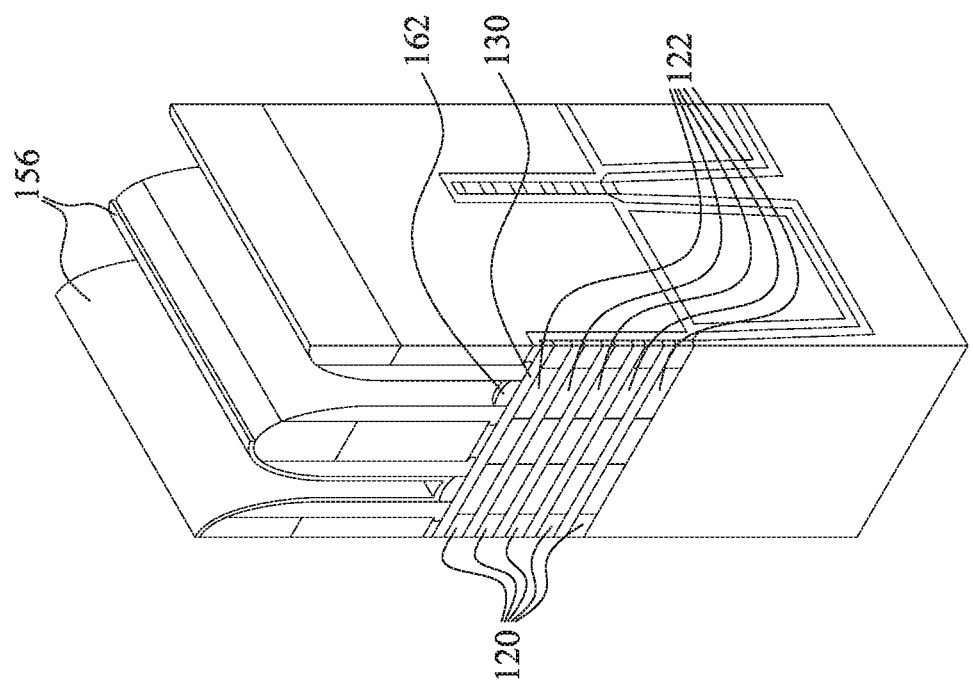

In operation 210A, the first-type semiconductor in the second hole 128 are removed, as illustrated in FIG. 38. Explained in another way, the third doping portions 129 disposed in the second holes 128 are removed, and the second holes 128 are exposed again. In operation 211A, the second holes 128 are refilled with second-type semiconductor to form the second doping portions 122, as illustrated in FIG. 39. In some embodiments, the second connection point 162 is formed on the second semiconductor 130 with the second-type semiconductor, and the second connection point 162 is aligned with the second doping portions 122. In operation 212A, BARC 156 is removed, as illustrated in FIG. 40. Explained in another way, the left part of the BARC 156 as illustrated in FIG. 39 is removed.

The above description of the method 200, 200A includes exemplary operations, but the operations of the method 200, 200A are not necessarily performed in the order described. The order of the operations of the method 200, 200A disclosed in the present disclosure are able to be changed, or the operations are able to be executed simultaneously or partially simultaneously as appropriate, in accordance with the spirit and scope of some embodiments of the present disclosure. In addition, the operations may be added, replaced, changed order, and/or eliminated as appropriate, in accordance with the spirit and scope of some embodiments of the present disclosure.

Figure 41:
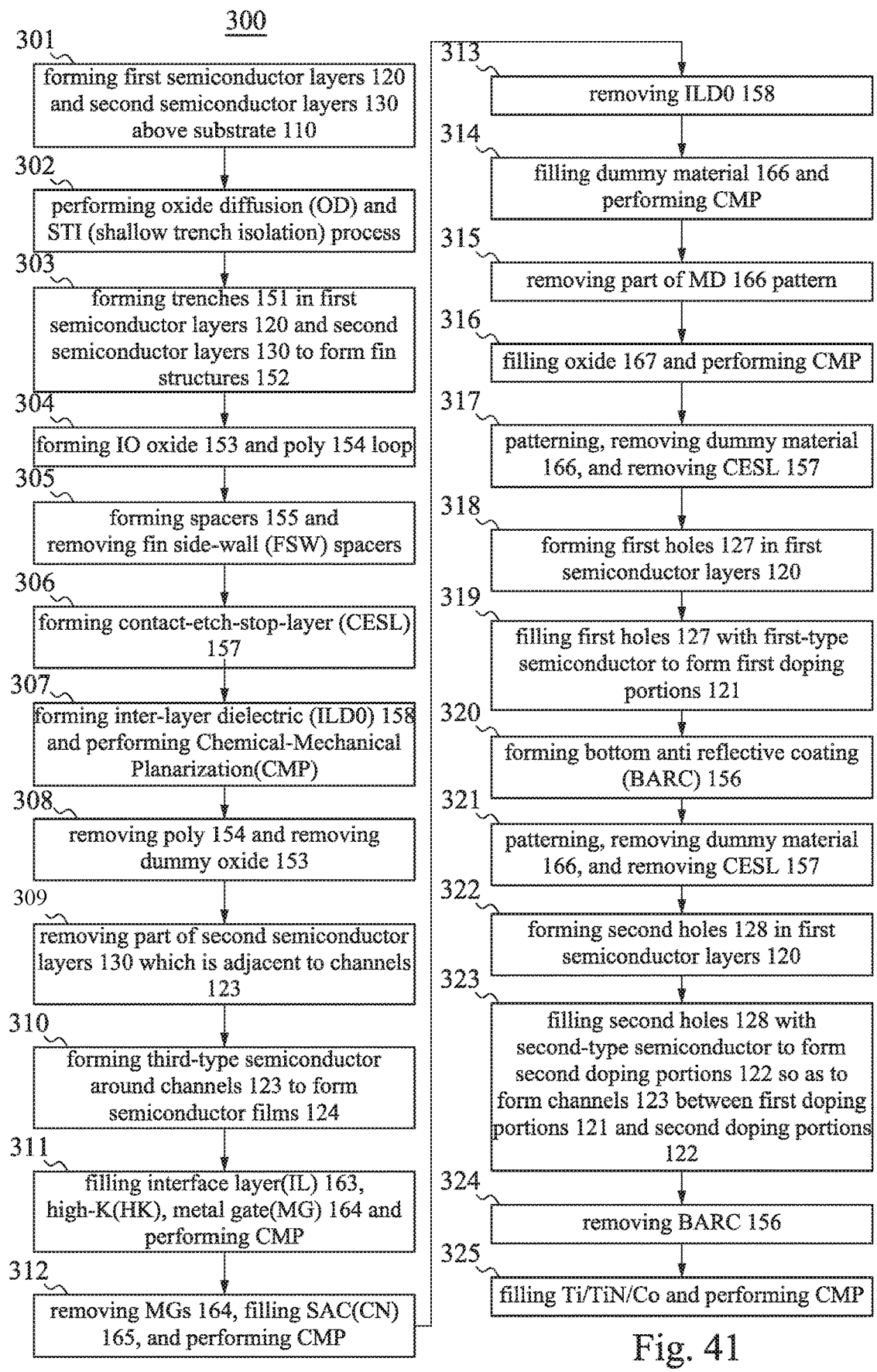
FIG. 41 is a flow chart of a method for fabricating the semiconductor device in FIG. 1, in accordance with various embodiments.

Reference is now made to FIG. 41. FIG. 41 is a flow chart of a method 300 for fabricating the semiconductor device 100 in FIG. 1, in accordance with various embodiments of the present disclosure. For illustration, the fabricating process of the semiconductor device 100 in FIG. 1 is described by the method 300 together with FIG. 42 to FIG. 65. FIG. 42 to FIG. 65 are cross-sectional views of different steps of the method 300 for fabricating the semiconductor device 100 in FIG. 1, in accordance with various embodiments.

Figure 42:
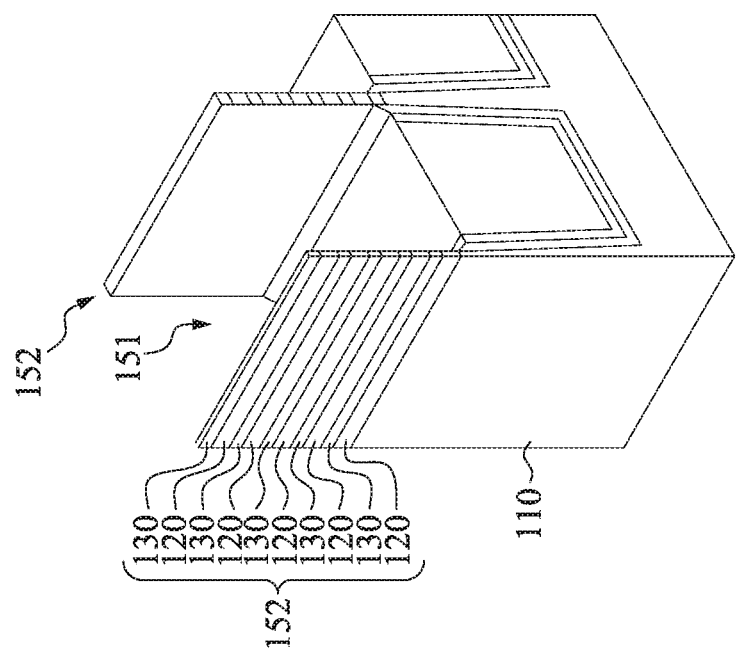

With reference to the method 300 in FIG. 3, in operations 301~303, first semiconductor layers 120 and second semiconductor layers 130 are formed above the substrate 110, oxide diffusion (OD) and STI (shallow trench isolation) process are performed thereon, and the first semiconductor layers 120 and the second semiconductor layers 130 are etched to form the trench 151 and fin structures 152, as illustrated in FIG. 42. In some embodiments, the first semiconductor layers 120 and the second semiconductor layers 130 are disposed in turn. Explained in another way, the sequence of the disposition is the first semiconductor layer 120, the second semiconductor layer 130, the first semiconductor layer 120, the second semiconductor layer 130, and so on. As illustrated in FIG. 42, the first semiconductor layer 120 is disposed with the substrate 110 in a parallel manner.

Figure 43:
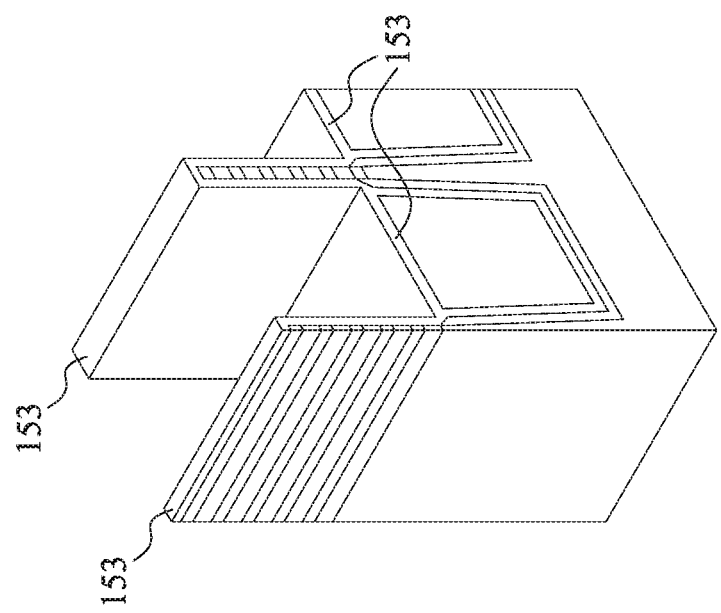
FIGS. 42-65 are cross sectional views of the semiconductor device in FIG. 1 at different stages of a manufacturing process, in accordance with some embodiments of the present disclosure.
Figure 45:
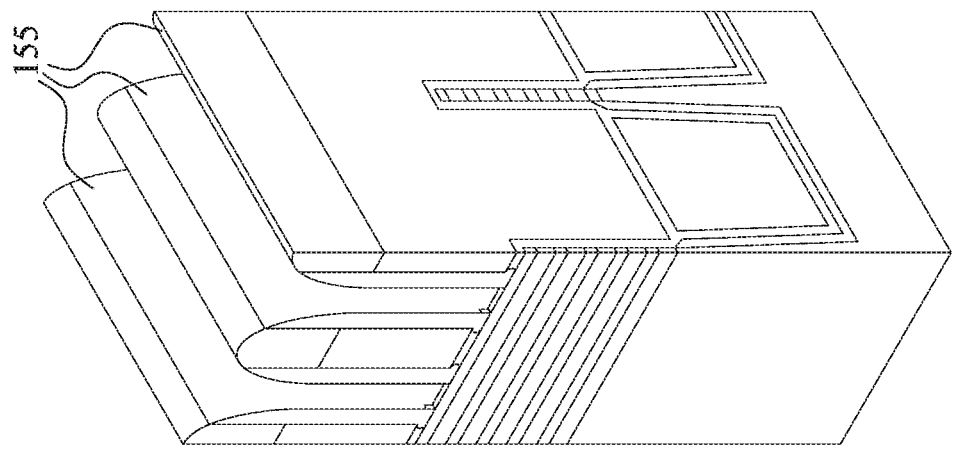
Figure 44:
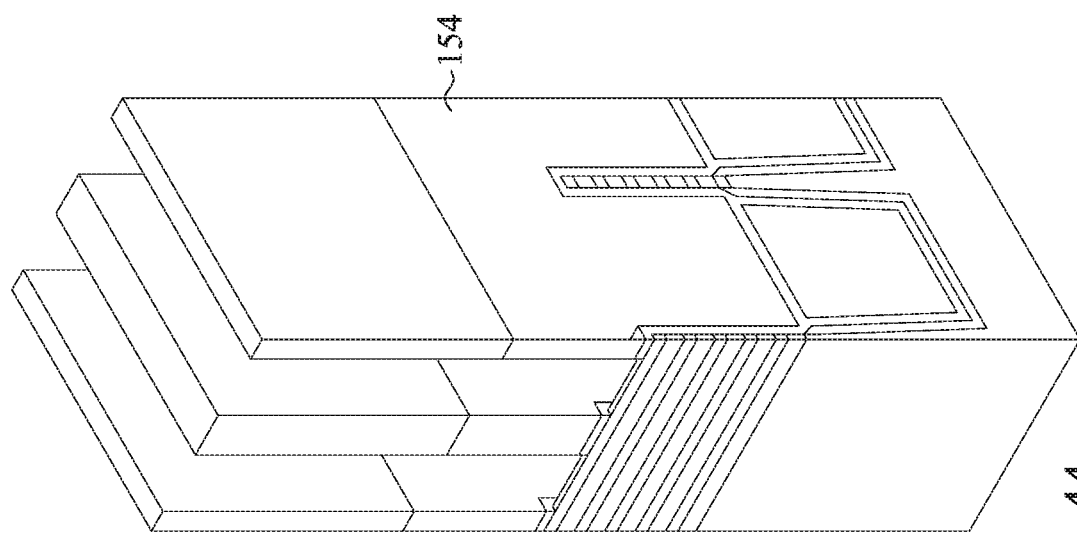
Figure 46:
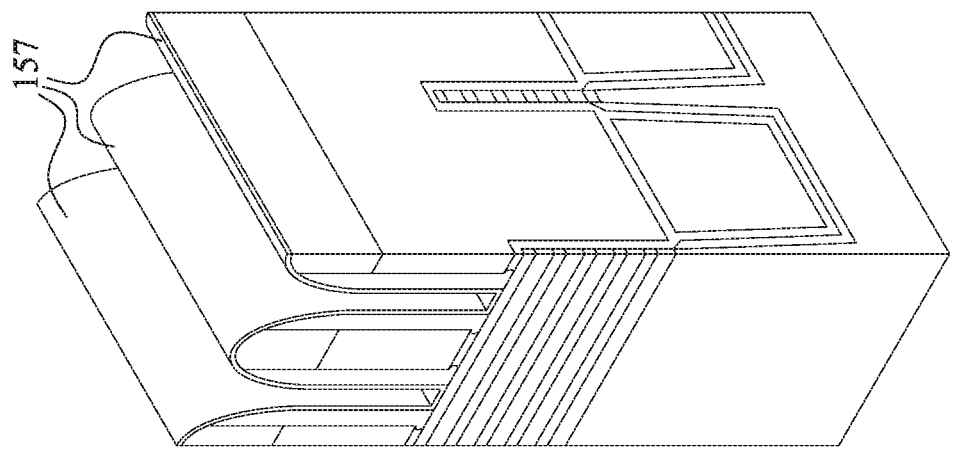
Figure 47:
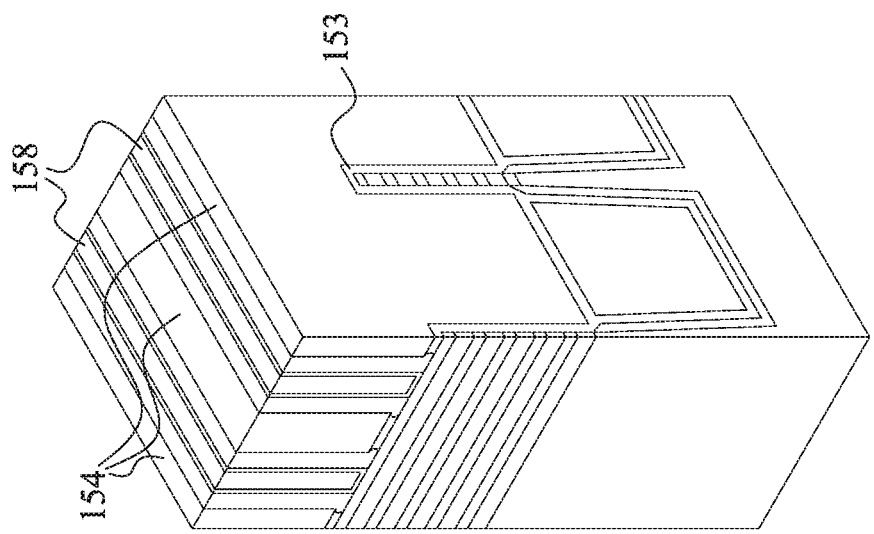
Figure 48:
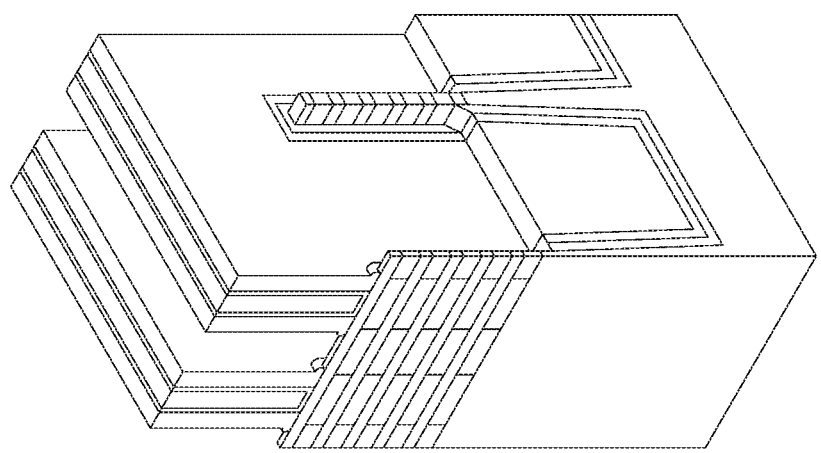

In operation 304, IO oxide 153 is forming, as illustrated in FIG. 43; subsequently, poly 154 loop is preformed, as illustrated in FIG. 44. In operation 305, spacers 155 are formed and fin side-wall spacers are removed, as illustrated in FIG. 45. In operation 306, a contact-etch-stop-layer (CESL) 157 is formed, as illustrated in FIG. 46. In operation 307, an inter-layer dielectric (ILD0) 158 is formed, and a Chemical-Mechanical Planarization (CMP) is performed, as illustrated in FIG. 47. In operation 308, the poly 154 is removed, and the dummy oxide 153 is removed as illustrated in FIG. 48.

Figure 49:
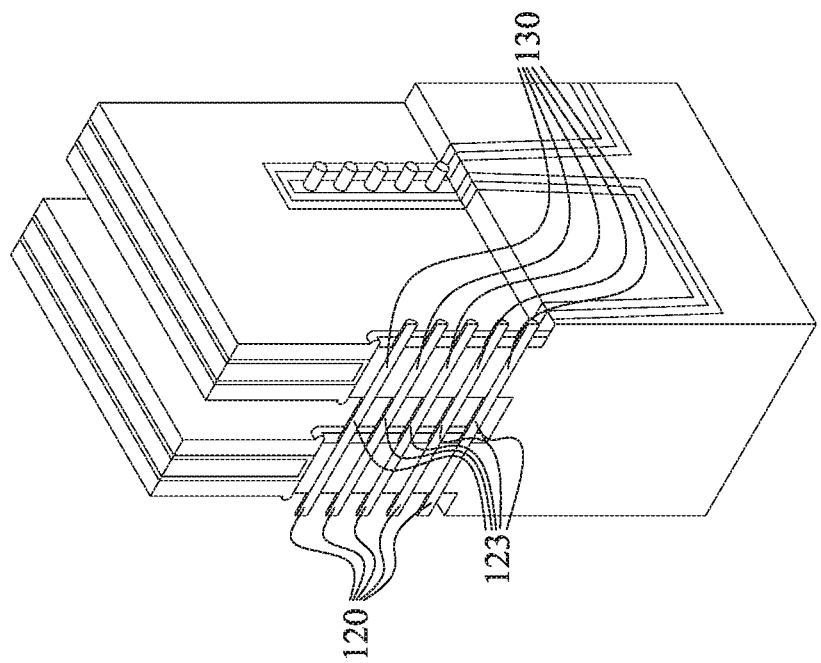
Figure 50:
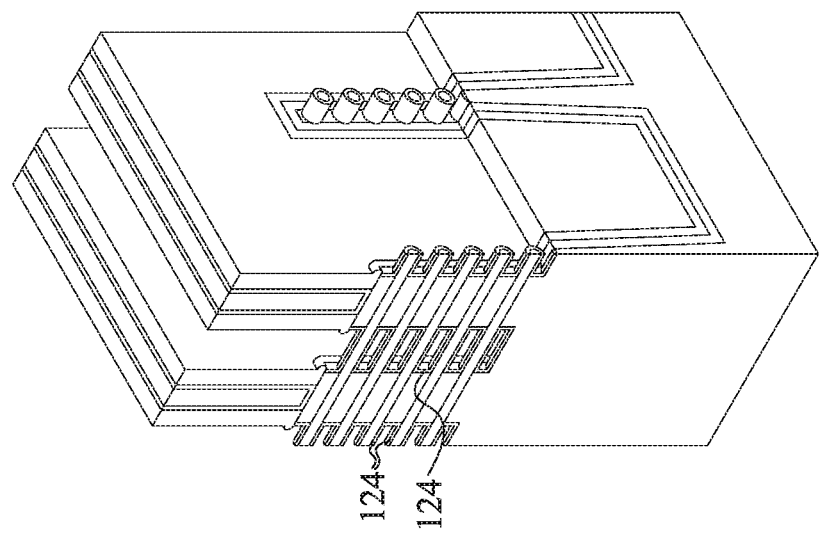

In operation 309, part of second semiconductor layers 130 which is adjacent to channels 123 are removed, as illustrated in FIG. 49. In operation 310, third-type semiconductor is formed around channels 123 to form semiconductor films 124, as illustrated in FIG. 50.

Figure 51:
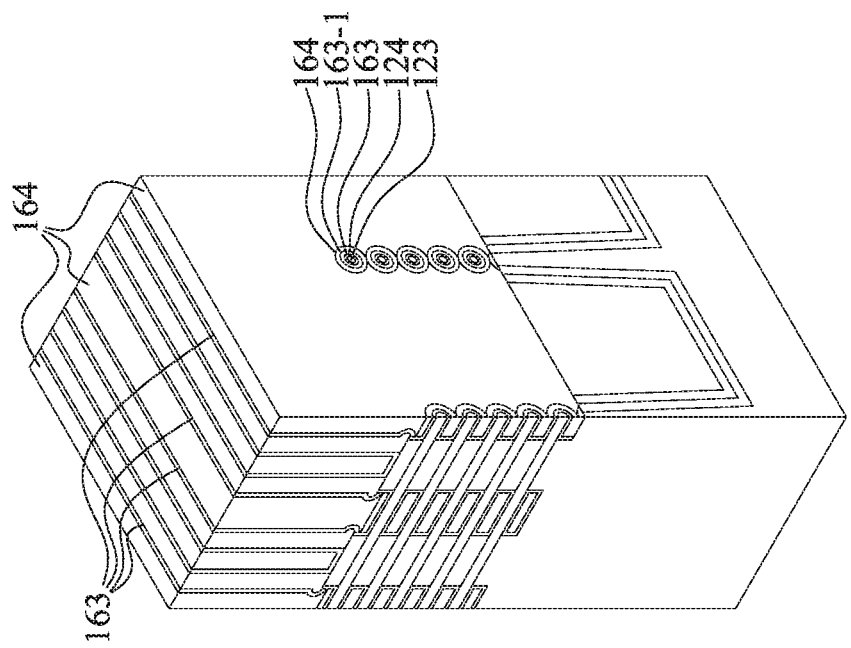
Figure 53:
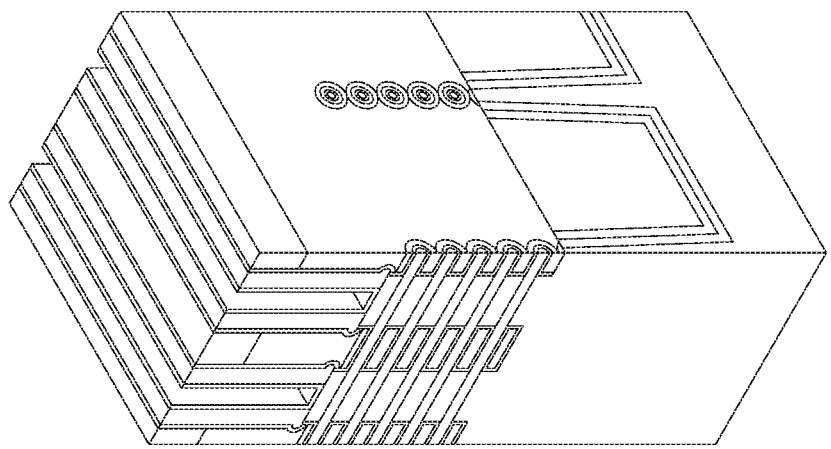
Figure 52:
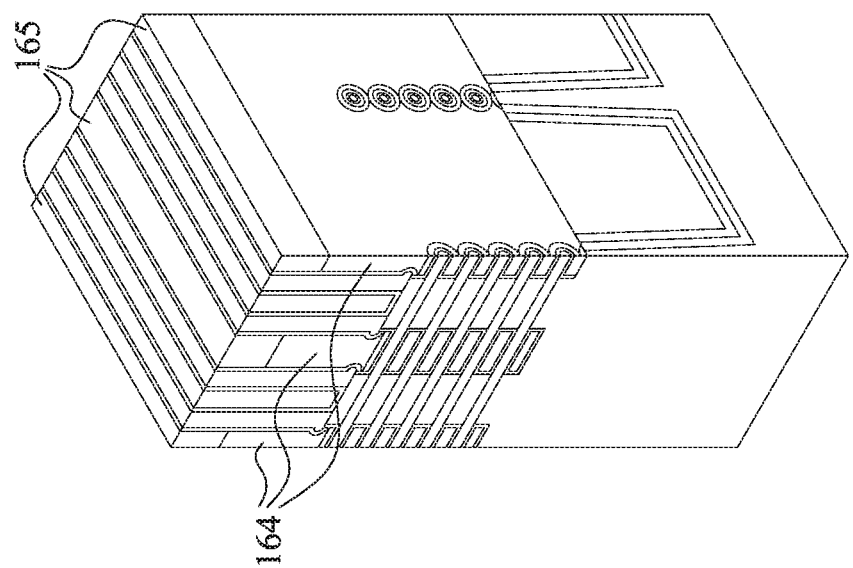
Figure 55:
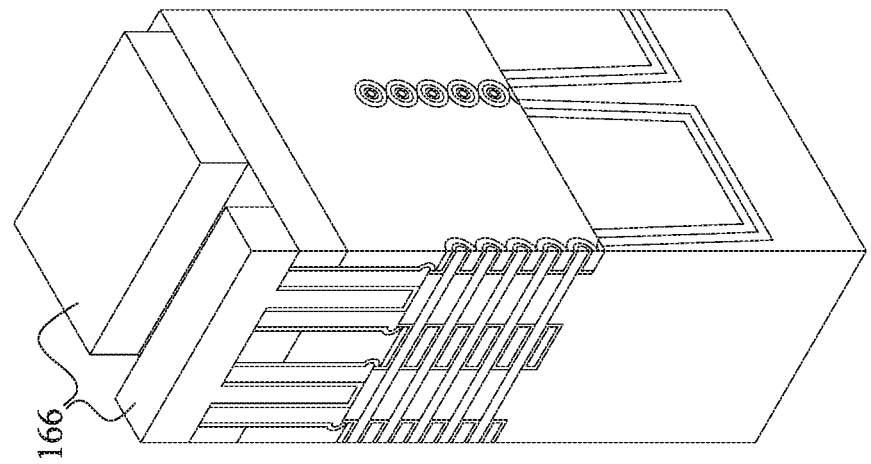
Figure 54:
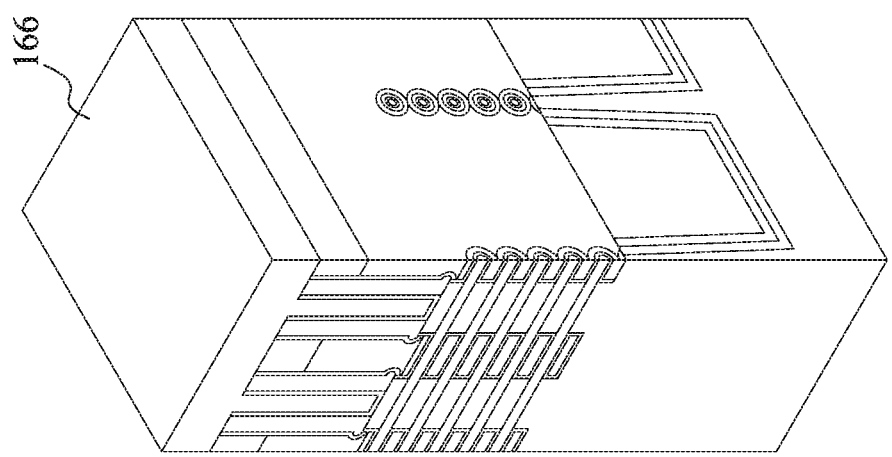
Figure 57:
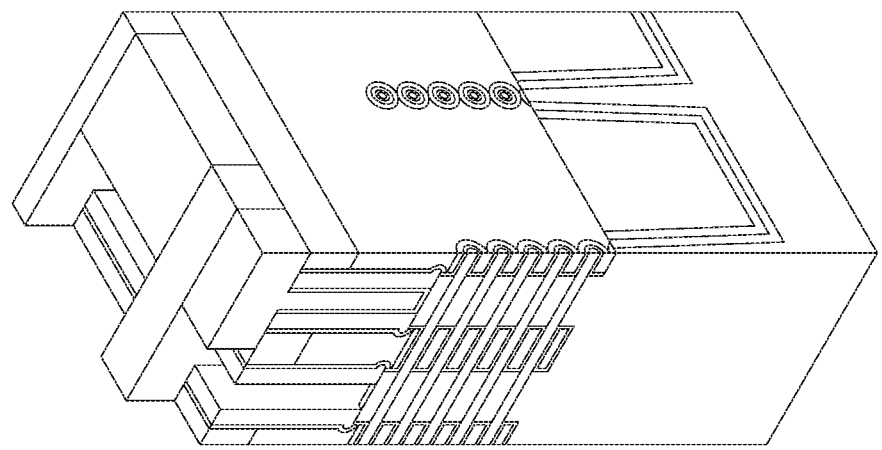
Figure 56:
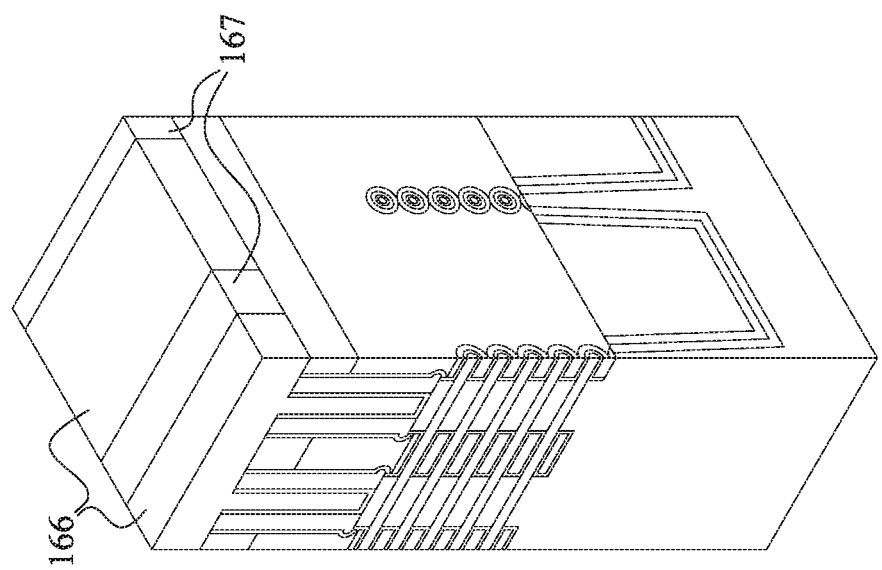

In operation 311, interface layers (IL) 163, high-K (HK) 163-1, metal gates (MG) 164 are filled, and CMP is performed, as illustrated in FIG. 51. In operation 312, part of the MGs 164 are removed, SAC (SN) 165 are filled, and CMP is performed as illustrated in FIG. 52. In operation 313, ILD0s 158 are removed, as illustrated in FIG. 53. In operation 314, dummy material 166 is filled, and CMP is performed as illustrated in FIG. 54. In operation 315, part of the dummy material 166 is removed, as illustrated in FIG. 55. In operation 316, oxides 167 are filled, and CMP is performed as illustrated in FIG. 56. In operation 317, the dummy material 166 is removed, and the CESL 157 is removed as illustrated in FIG. 57.

Figure 59:
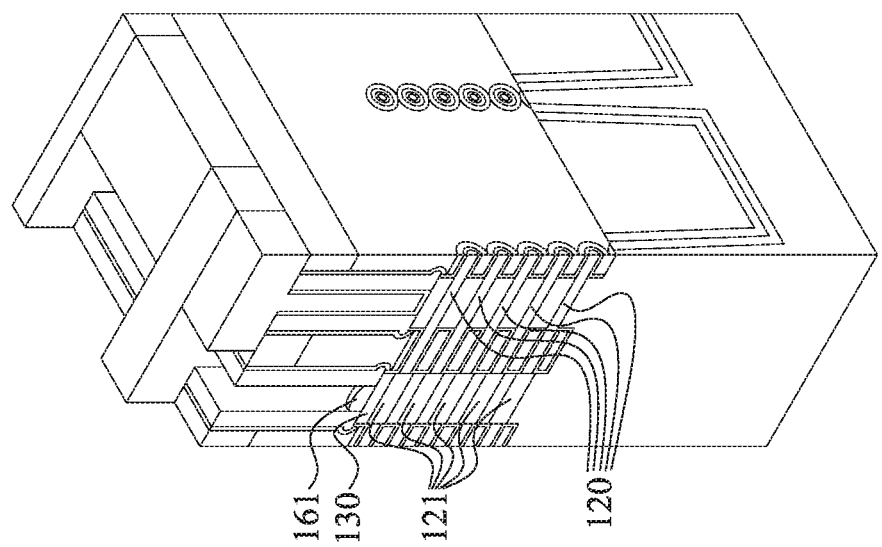
Figure 58:
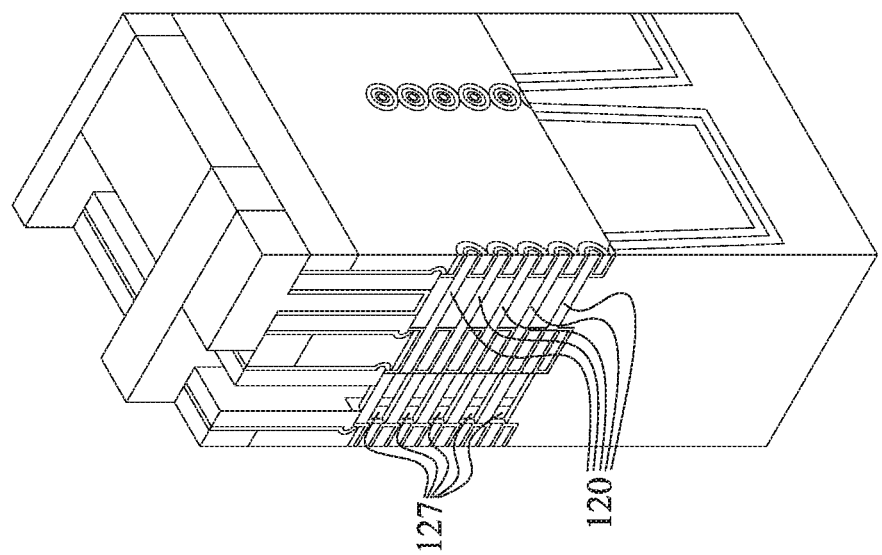

In operation 318, first holes 127 in the first semiconductor layers 120 are formed, as illustrated in FIG. 58. Explained in another way, the left part of the first semiconductor layers 120 are etched to form such first holes 127. In operation 319, the first holes 127 are filled with first-type semiconductor to form first doping portions 121, as illustrated in FIG. 59. In some embodiments, a first connection point 161 is formed on the second semiconductor 130 with the first-type semiconductor, and the first connection point 161 is aligned with the first doping portions 121.

Figure 61:
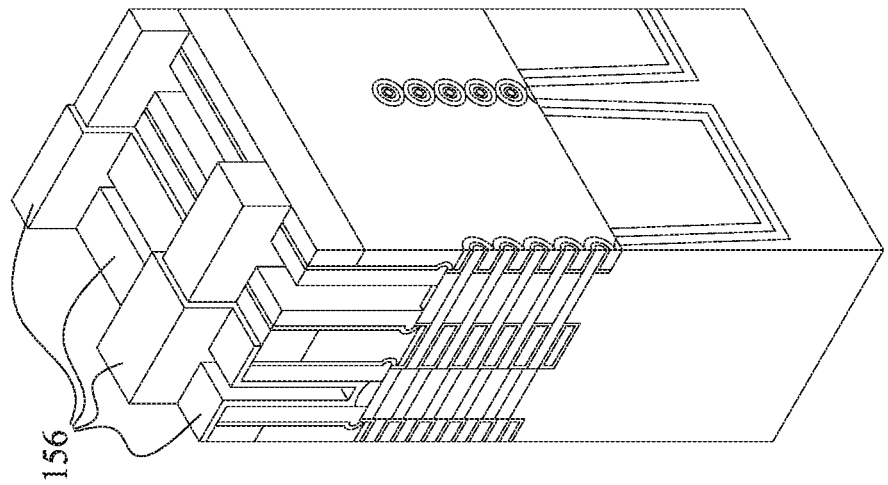
Figure 60:
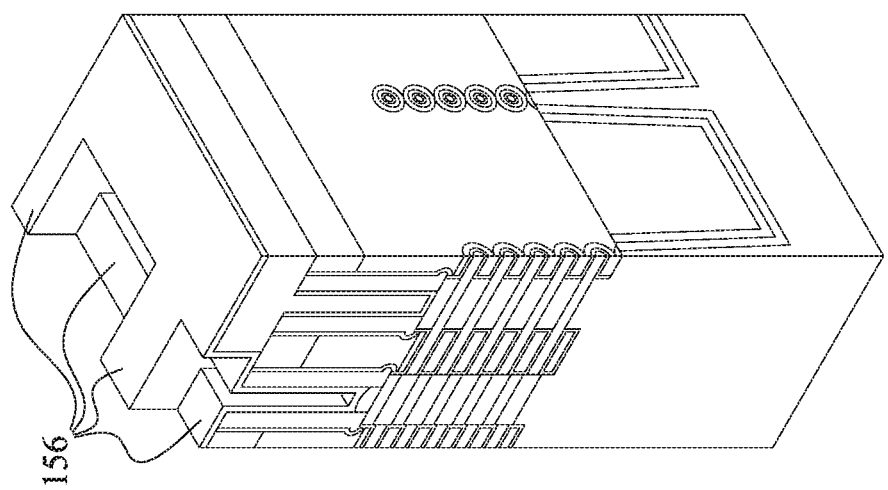

In operation 320, a bottom anti reflective coating (BARC) 156 is formed, as illustrated in FIG. 60. In operation 321, BARC 156 is patterned, the dummy material 166 is removed, and the CESL 157 is removed, as illustrated in FIG. 61. Explained in another way, the right part of the BARC 156 as illustrated in FIG. 60 is removed.

Figure 63:
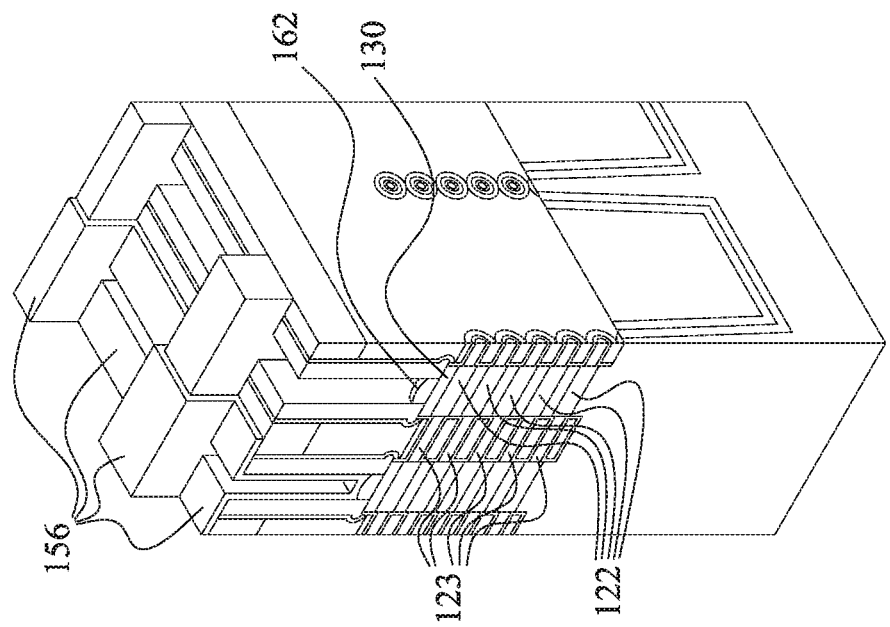
Figure 62:
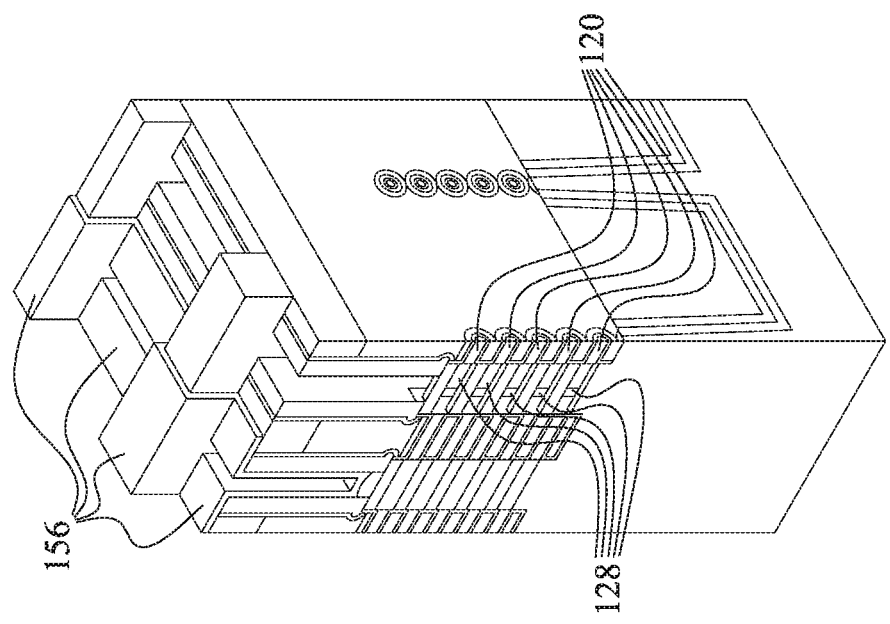

In operation 322, second holes 128 in the first semiconductor layers 120 are formed, as illustrated in FIG. 62. Explained in another way, the right part of the first semiconductor layers 120 are etched to form such second holes 128. In operation 323, the second holes 128 are filled with second-type semiconductor to form second doping portions 122 so as to form channels 123 between the first doping portions 121 and the second doping portions 122, as illustrated in FIG. 63. In some embodiments, a second connection point 162 is formed on the second semiconductor 130 with the second-type semiconductor, and the second connection point 162 is aligned with the second doping portions 122. As illustrated in FIG. 63, in one of the first semiconductor layer 120, the channel 123 is located between the first doping portion 121 and the second doping portion 122, and the first doping portion 121, the channel 123 and the second doping portion 122 are disposed in sequence.

Figure 65:
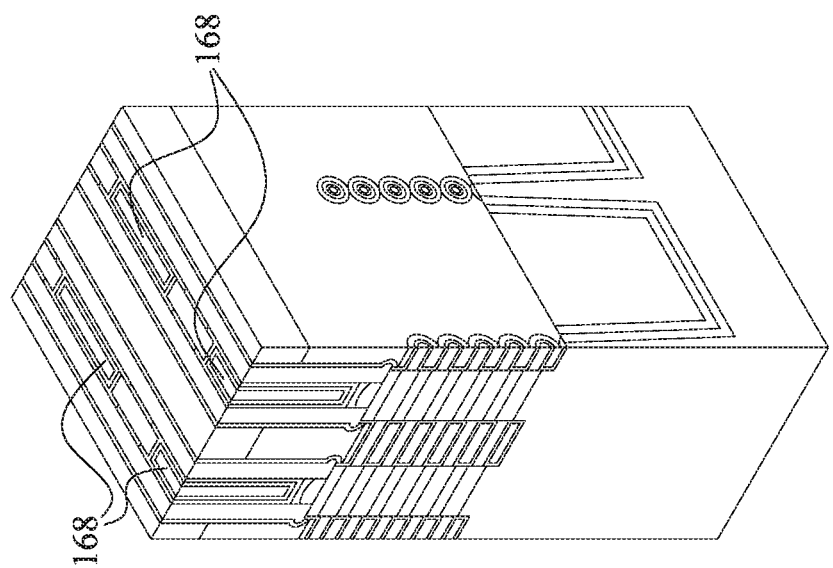
Figure 64:
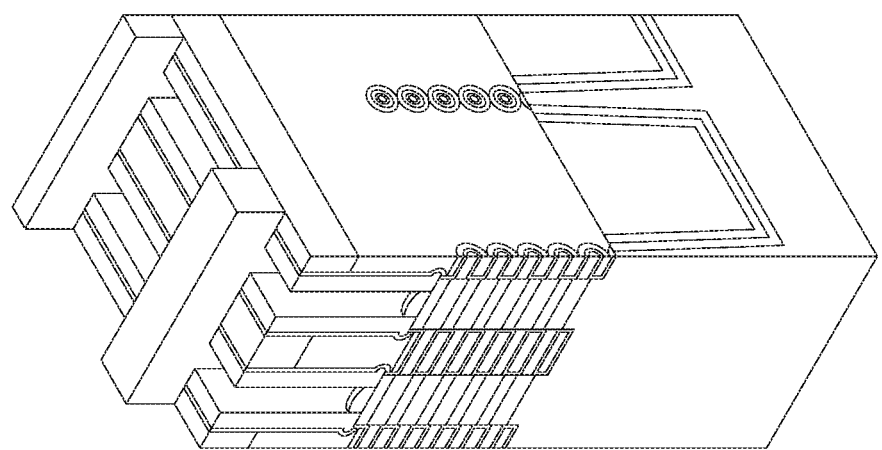

In operation 324, BARC 156 is removed, as illustrated in FIG. 64. Explained in another way, the left part of the BARC 156 as illustrated in FIG. 63 is removed. In operation 325, Ti/TiN/Co 168 is filled, and CMP is performed as illustrated in FIG. 65.

In some embodiments, operations 317~324 regarding FIGS. 57-64 are performed to form the first doping portions 121, the channels 123 and the second doping portions 122. However, the manufacturing process of above-mentioned structures are not limited to operations 317~324 regarding FIGS. 57-64. In various embodiments, such manufacturing processes of above-mentioned structures are described by the method 300A in FIG. 66 together with FIG. 67 to FIG. 75.

Figure 66:
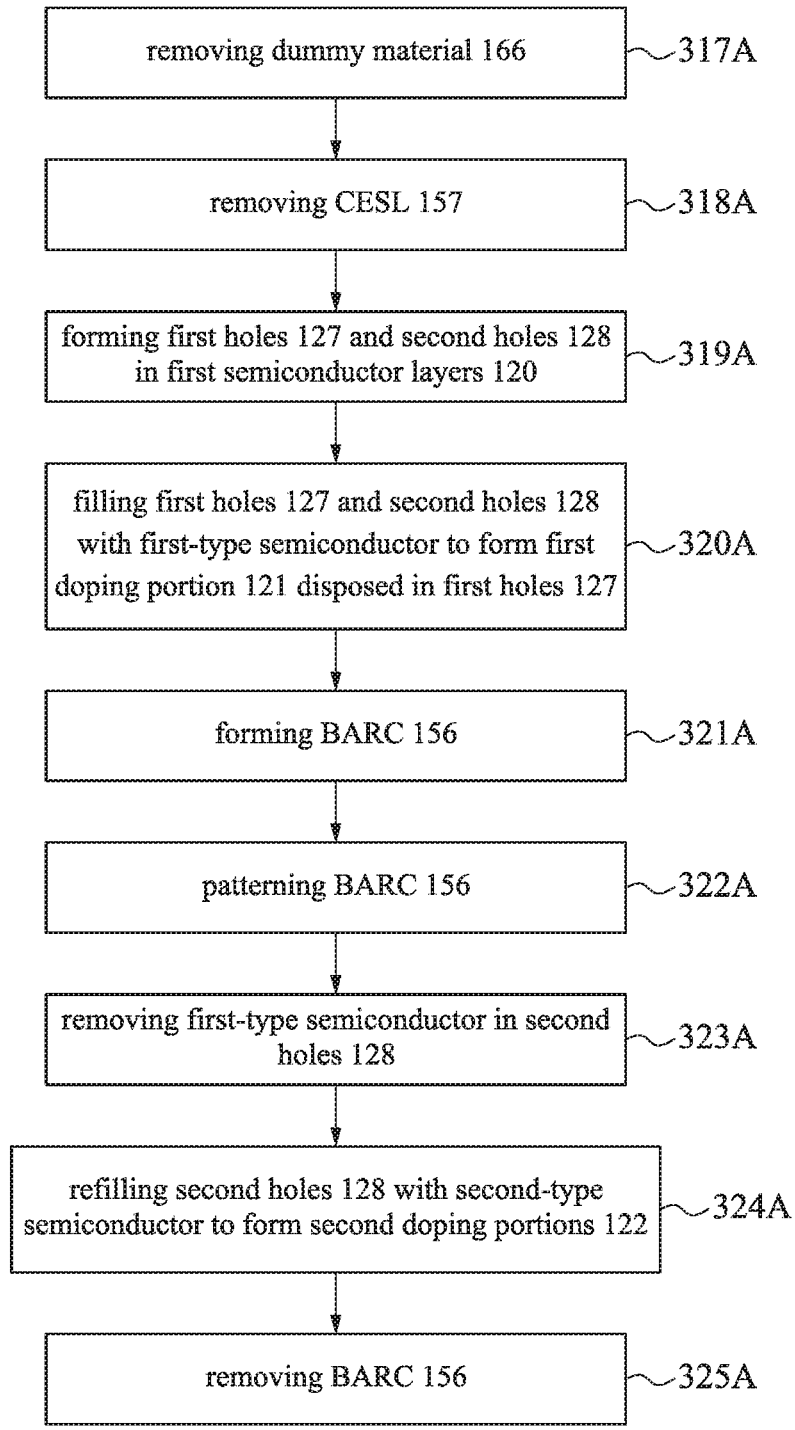
FIG. 66 is a flow chart of a method for fabricating the semiconductor device in FIG. 1, in accordance with various embodiments.
Figure 67:
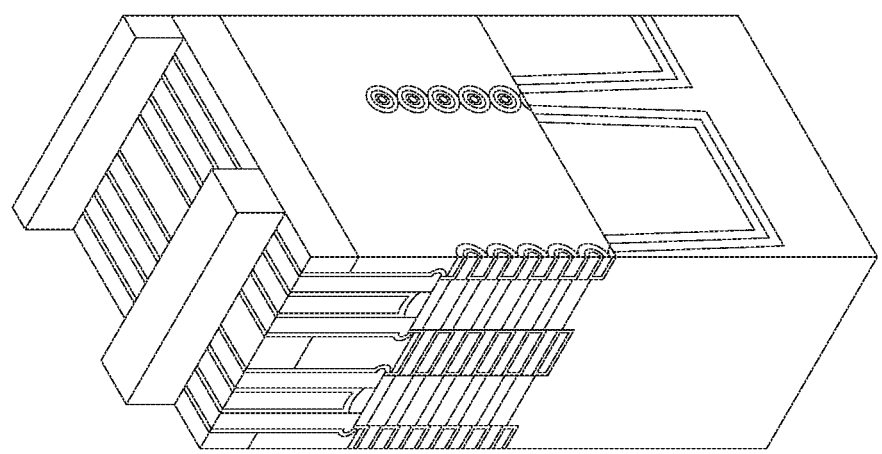
FIGS. 67-75 are cross sectional views of the semiconductor device in FIG. 1 at different stages of a manufacturing process, in accordance with some embodiments of the present disclosure.
Figure 68:
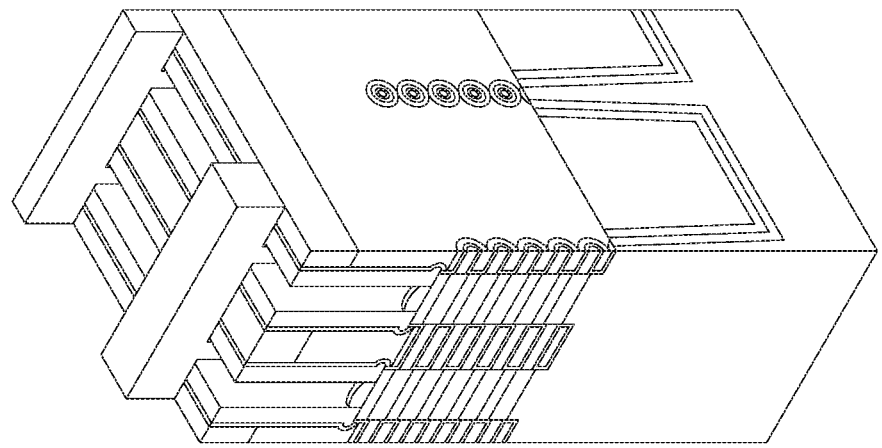
Figure 69:
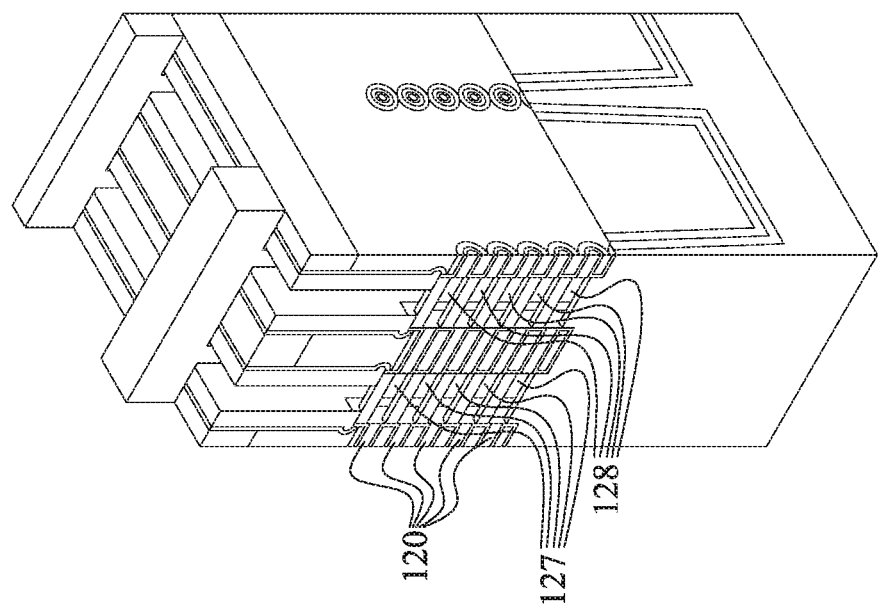

After operation 316 in FIG. 41, in operation 317A of FIG. 66, the dummy material 166 is removed, as illustrated in FIG. 67. In operation 318A, the CESL 157 is removed, as illustrated in FIG. 68. In operation 319A, the first holes 127 and the second holes 128 in the first semiconductor layers 120 are formed, as illustrated in FIG. 69. In some embodiments, the first holes 127 and the second holes 128 are formed at same time.

Figure 70:
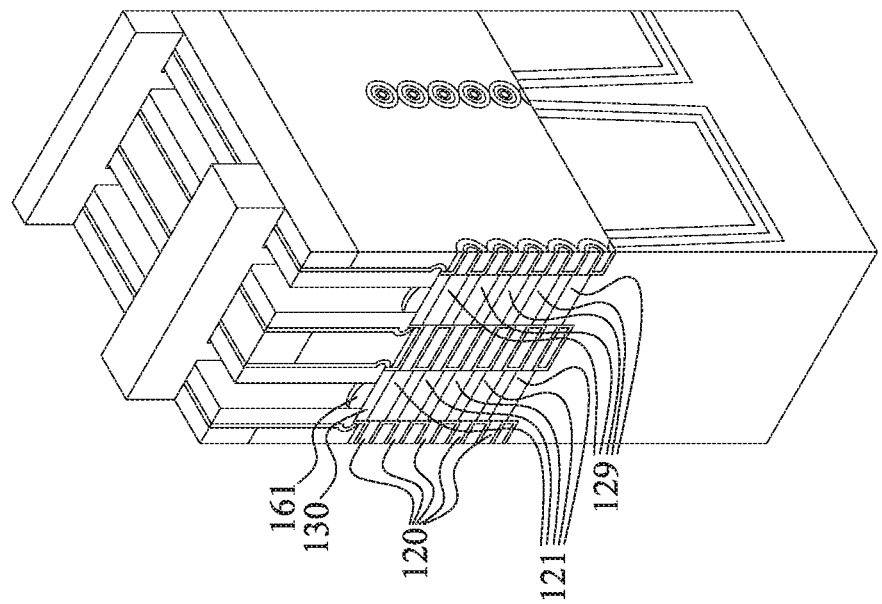
Figure 72:
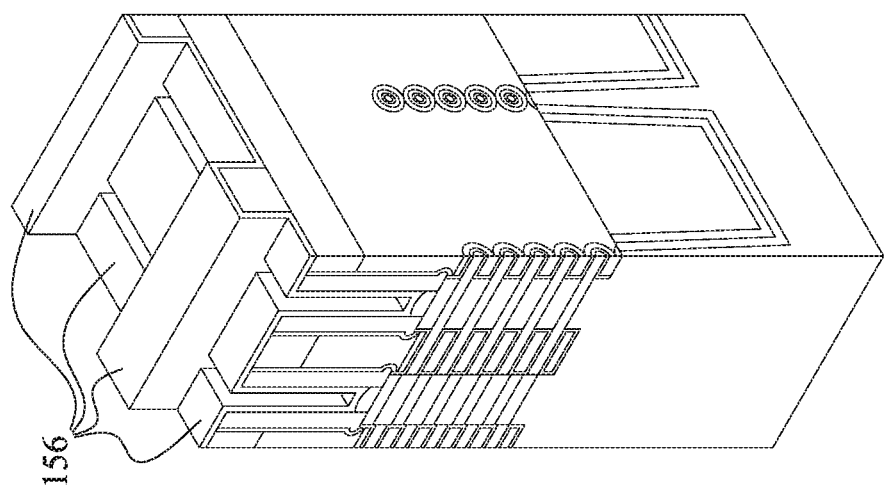
Figure 71:
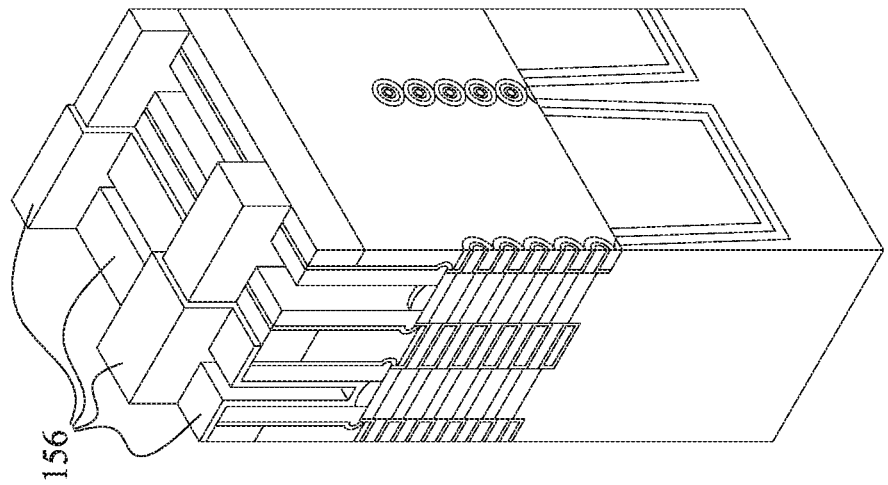

In operation 320A, the first holes 127 and the second holes 128 are filled with first-type semiconductor to form the first doping portions 121 disposed in the first holes 127, and to form third doping portions 129 disposed in the second holes 128, as illustrated in FIG. 70. In some embodiments, a first connection point 161 is formed on the second semiconductor 130 with the first-type semiconductor, and the first connection point 161 is aligned with the first doping portions 121. In operation 321A, BARC 156 is formed, as illustrated in FIG. 71. In operation 322A, BARC 156 is patterned, as illustrated in FIG. 72. Explained in another way, the right part of the BARC 156 as illustrated in FIG. 71 is removed.

Figure 74:
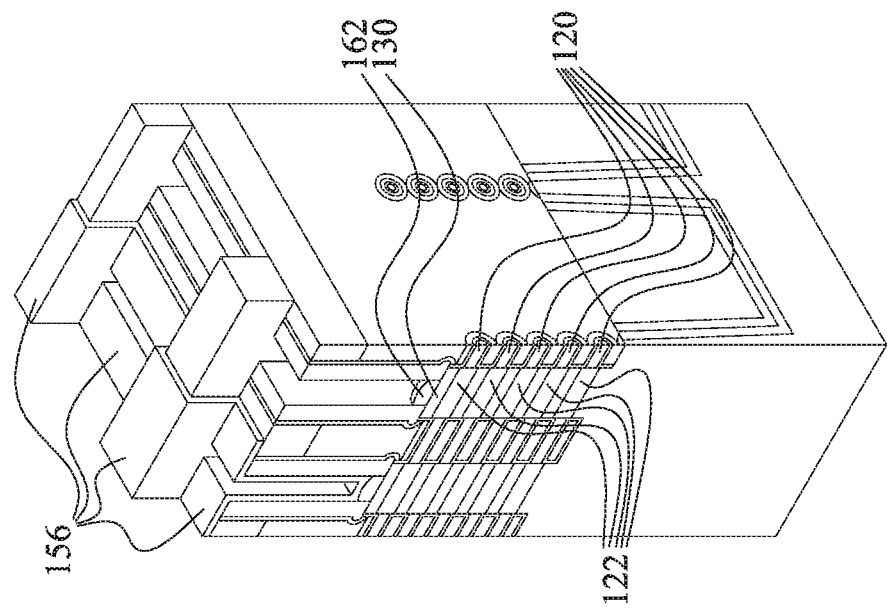
Figure 73:
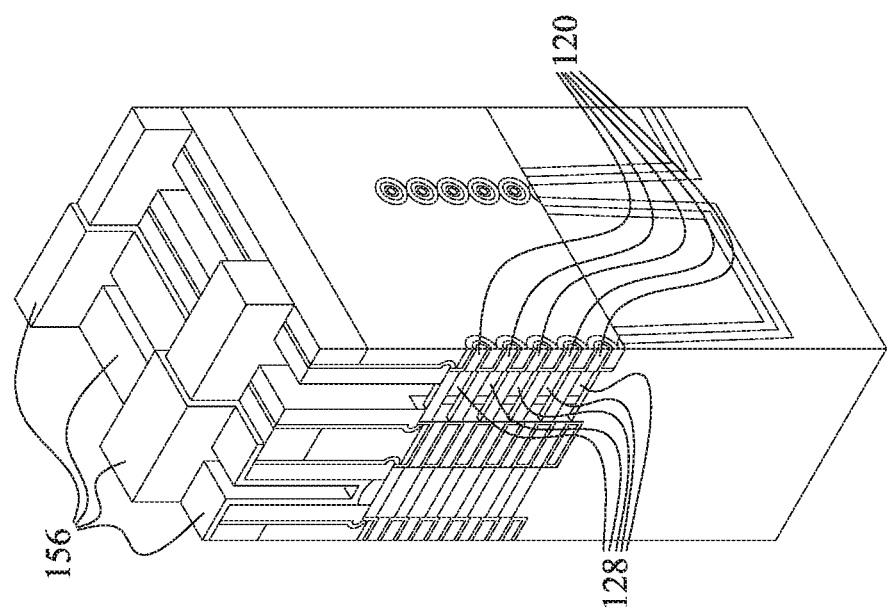
Figure 75:
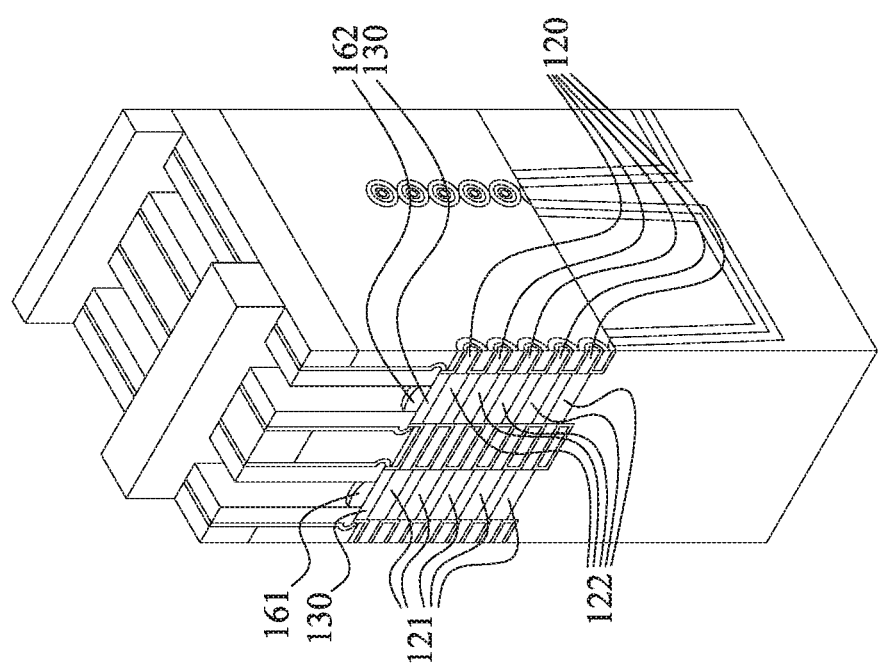

In operation 323A, the first-type semiconductor in the second hole 128 are removed, as illustrated in FIG. 73. Explained in another way, the third doping portions 129 disposed in the second holes 128 are removed, and the second holes 128 are exposed again. In operation 324A, the second holes 128 are refilled with second-type semiconductor to form the second doping portions 122, as illustrated in FIG. 74. In some embodiments, the second connection point 162 is formed on the second semiconductor 130 with the second-type semiconductor, and the second connection point 162 is aligned with the second doping portions 122. In operation 325A, BARC 156 is removed, as illustrated in FIG. 75. Explained in another way, the left part of the BARC 156 as illustrated in FIG. 74 is removed.

The above description of the method 300, 300A includes exemplary operations, but the operations of the method 300, 300A are not necessarily performed in the order described. The order of the operations of the method 300, 300A disclosed in the present disclosure are able to be changed, or the operations are able to be executed simultaneously or partially simultaneously as appropriate, in accordance with the spirit and scope of some embodiments of the present disclosure. In addition, the operations may be added, replaced, changed order, and/or eliminated as appropriate, in accordance with the spirit and scope of some embodiments of the present disclosure.

In some embodiments, a semiconductor device is disclosed that includes a substrate, at least one first semiconductor layer, and at least one second semiconductor layer. The at least one first semiconductor layer is disposed on the substrate, and the at least one second semiconductor layer is disposed on the at least one first semiconductor layer. The at least one first semiconductor layer includes a first doping portion, a second doping portion, a channel, and a semiconductor film. The second doping portion is adjacent to the first doping portion. The channel is disposed between the first doping portion and the second doping portion, and disposed with the substrate in parallel. The semiconductor film is disposed around the channel.

Also disclosed is a method for fabricating a semiconductor device includes operations outlined below. The at least one first semiconductor layer and at least one second semiconductor layer are formed above a substrate, wherein the at least one first semiconductor layer and the at least one second semiconductor layer are disposed in turn, and the first semiconductor layer is disposed above the substrate in a parallel manner. At least one trench is formed in the at least one first semiconductor layer and the at least one second semiconductor layer to form at least one fin structure. A first hole in the at least one first semiconductor layer of the fin structure is formed. The first hole is filled with first-type semiconductor to form a first doping portion. A second hole in the at least one first semiconductor layer of the fin structure is formed. The second hole is filled with second-type semiconductor to form a second doping portion so as to form at least one channel between the first doping portion and the second doping portion.

Also disclosed is a method for fabricating a semiconductor device includes operations outlined below. A plurality of first semiconductor layers and second semiconductor layers are deposited on a substrate, wherein the first semiconductor layers and the second semiconductor layers are disposed in turn. The first semiconductor layers and the second semiconductor layers are etched to form fin structures. Each of the first semiconductor layers is etched to form a first hole and a second hole. The first doping portions and second doping portions are epitaxial growing in the first holes and the second holes respectively to form channels between the first doping portions and the second doping portions, wherein the first doping portions are overlapped with each other and disposed with the substrate vertically, and the second doping portions are overlapped with each other and disposed with the substrate vertically.

In some embodiments of the present disclosure, a device includes a substrate, a first doped portion, a second doped portion, a channel, a semiconductor film, a high-k layer, and a gate. The first doped portion and the second doped portion are over the substrate. The channel is over the substrate and between the first doped portion and the second doped portion. The semiconductor film is around the channel. The high-k layer is around the semiconductor film. The gate is over the high-k layer.

In some embodiments of the present disclosure, a device includes a substrate, a first doped portion, a second doped portion, a channel, a first semiconductor portion, a high-k layer, a gate, and a semiconductor film. The first doped portion and the second doped portion are over the substrate. The channel is over the substrate and between the first doped portion and the second doped portion. The first semiconductor portion is surrounded by the first doped portion. The high-k layer is around the channel. The gate over the high-k layer. The semiconductor film is over a sidewall of the first semiconductor portion.

In some embodiments of the present disclosure, a device includes a device includes a substrate, a first doped portion, a second doped portion, a channel, n interface layer, a high-k layer, a gate, and a semiconductor film. The first doped portion and the second doped portion are over the substrate. The channel is over the substrate and between the first doped portion and the second doped portion. The interface layer is around the channel. The high-k layer is around the channel. The gate over the high-k layer. The semiconductor film is between the interface layer and the channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A tunnel field-effect transistor (TFET) comprising:
   a first epitaxial layer formed of a first semiconductive material;
   a second epitaxial layer formed of the first semiconductive material, the second epitaxial layer being over and spaced apart from the first epitaxial layer, wherein the first epitaxial layer and the second epitaxial layer form a channel of the TFET;
   a gate structure surrounding each of the first and second epitaxial layers;
   a source feature having a first type of conductivity; and
   a drain feature having a second type of conductivity that is different from the first type of conductivity, the source feature and the drain feature being on opposite sides of the gate structure, wherein the first epitaxial layer and the second epitaxial layer extend between the source feature and the drain feature.

2. The TFET of claim 1, further comprising:
   a third epitaxial layer formed of a second semiconductive material, wherein the source feature surrounds the third epitaxial layer.

3. The TFET of claim 2, further comprising:
   a fourth epitaxial layer formed of the second semiconductive material, wherein the drain feature surrounds the fourth epitaxial layer.

4. The TFET of claim 1, wherein the first type of conductivity is N type, and the second type of conductivity is P type.

5. The TFET of claim 1, wherein the first type of conductivity is P type, and the second type of conductivity is N type.

6. The TFET of claim 1, wherein the source feature comprises InGaAs, Ge, group II-doped InGaAs, GaSb, GaAsSb, GeSn, or combinations thereof.

7. The TFET of claim 1, wherein the drain feature comprises InGaAs, SiGe, Ge, GeSn, or combinations thereof.

8. The TFET of claim 1, further comprising:
   a semiconductive film surrounding each of the first epitaxial layer and the second epitaxial layer, wherein the first epitaxial layer, the second epitaxial layer, and the semiconductive film form the channel of the TFET.

9. The TFET of claim 8, wherein the semiconductive film is in contact with each of the first epitaxial layer and the second epitaxial layer.

10. A transistor comprising:
a first epitaxial layer formed of a first semiconductive material;
a second epitaxial layer formed of the first semiconductive material, the second epitaxial layer being over and spaced apart from the first epitaxial layer;
a semiconductive film surrounding each of the first epitaxial layer and the second epitaxial layer, wherein the first epitaxial layer, the second epitaxial layer, and the semiconductive film form a channel of the transistor;
a gate structure surrounding the semiconductive film; and
first and second source/drain features disposed on opposite sides of the gate structure, wherein the first epitaxial layer and the second epitaxial layer extend between the first and second source/drain features, and wherein the semiconductive film has a first portion surrounding the first epitaxial layer, a second portion surrounding the second epitaxial layer, and a third portion extending from the first portion to the second portion.

11. The transistor of claim 10, further comprising:
a third epitaxial layer formed of a second semiconductive material, wherein the first source/drain feature surrounds the third epitaxial layer, and the third portion of the semiconductive film is in contact with the third epitaxial layer.

12. The transistor of claim 11, further comprising:
a fourth epitaxial layer formed of the second semiconductive material, wherein the second source/drain feature surrounds the fourth epitaxial layer, the semiconductive film has a fourth portion extending from the first portion of the semiconductive film to the second portion of the semiconductive film, and the fourth portion of the semiconductive film is in contact with the fourth epitaxial layer.

13. The transistor of claim 10, wherein the first source/drain feature comprises an N type semiconductive material, and the second source/drain feature comprises a P type semiconductive material.

14. A semiconductor device structure comprising:
a substrate; and
a tunnel field-effect transistor (TFET) over the substrate, the TFET comprising:
a first epitaxial layer formed of a first semiconductive material, the first epitaxial layer being over and spaced apart from the substrate;
first and second source/drain features, wherein the first epitaxial layer extends between the first and second source/drain features, and wherein the first source/drain feature comprises a P type semiconductive material, and the second source/drain feature comprises an N type semiconductive material;
a semiconductive film surrounding the first epitaxial layer, wherein the first epitaxial layer and the semiconductive film form a channel of the transistor between the first and second source/drain features; and
a gate structure surrounding the semiconductive film.

15. The semiconductor device structure of claim 14, wherein the transistor further comprises:
a semiconductor layer adjacent to the gate structure and formed of a second semiconductive material, wherein the first source/drain feature surrounds the semiconductor layer.

16. The semiconductor device structure of claim 15, wherein the semiconductive film has a portion extending along a sidewall of the semiconductor layer.

17. The semiconductor device structure of claim 14, further comprising:
a fin extending upwardly from the substrate, wherein the first epitaxial layer is over and spaced apart from the fin.

18. The semiconductor device structure of claim 14, wherein the gate structure has an interfacial layer surrounding and in contact with the semiconductive film.

19. The semiconductor device structure of claim 15, wherein the semiconductive film extends from a sidewall of the semiconductor layer to a surface of the first epitaxial layer.

20. The semiconductor device structure of claim 14, wherein the semiconductor film is in contact with a sidewall of the gate structure.

* * * * *